US012793945B2

(12) United States Patent
Ishimaru

(10) Patent No.: US 12,793,945 B2
(45) Date of Patent: Nov. 10, 2026

(54) SUBSTRATE PROCESSING APPARATUS

(71) Applicant: Kokusai Electric Corporation, Tokyo (JP)

(72) Inventor: Nobuo Ishimaru, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1126 days.

(21) Appl. No.: 17/025,471

(22) Filed: Sep. 18, 2020

(65) Prior Publication Data

US 2021/0090861 A1 Mar. 25, 2021

(30) Foreign Application Priority Data

Sep. 25, 2019 (JP) ................................ 2019-173903

(51) Int. Cl.
*H01J 37/32* (2006.01)
*C23C 16/455* (2006.01)
*C23C 16/50* (2006.01)

(52) U.S. Cl.
CPC .. *H01J 37/32559* (2013.01); *C23C 16/45536* (2013.01); *C23C 16/45563* (2013.01);
(Continued)

(58) Field of Classification Search
CPC ......... H01L 21/67161; H01L 21/67178; H01L 21/67303; H01L 21/67313; H01L 21/6732; H01L 21/67326; H01L 21/31; H01L 21/318; H01J 37/32082; H01J 37/32431; H01J 37/3244; H01J 37/32449; H01J 37/32495; H01J 37/32532;
(Continued)

(56) References Cited

U.S. PATENT DOCUMENTS 3,172,721 A * 3/1965 Kelly .................. H01R 13/434 29/446
4,799,451 A * 1/1989 Gardner ............ H01J 37/32431 118/728
(Continued)

FOREIGN PATENT DOCUMENTS

JP 2004-134465 A 4/2004
JP 2004-200345 A 7/2004
(Continued)

*Primary Examiner* — Gordon Baldwin
*Assistant Examiner* — Joshua Reyes
(74) *Attorney, Agent, or Firm* — Volpe Koenig

(57) ABSTRACT

Described herein is a technique capable of reducing a damage to a reaction tube and an electrode when processing a substrate using plasma as well as generating the plasma stably. According to one aspect thereof, there is provided a substrate processing apparatus including: a process chamber; a buffer chamber where a gas is circulated before being supplied to a substrate; a pair of discharge electrodes extending parallel to each other in the buffer chamber; and a pair of sheath tubes configured to cover the pair of the discharge electrodes to prevent them from being exposed to the gas. A metal cap, whose outer diameter is equal to that of the discharge electrode and whose front end is rounded, is provided at one end of one or each of the discharge electrodes other than the other end of the one or each of the discharge electrodes supplied with electric power.

21 Claims, 8 Drawing Sheets

(52) U.S. Cl.
CPC ........ *C23C 16/50* (2013.01); *H01J 37/32449* (2013.01); *H01J 37/32541* (2013.01); *H01J 2237/3321* (2013.01)

(58) Field of Classification Search
CPC ............. H01J 37/32541; H01J 37/3255; H01J 37/32559; H01J 37/32596; H01J 2237/3321; C23C 16/452; C23C 16/45525; C23C 16/45536; C23C 16/45546; C23C 16/45563; C23C 16/45587; C23C 16/50; C23C 16/509
See application file for complete search history.

(56) References Cited

U.S. PATENT DOCUMENTS

| | | | | | |
|---|---|---|---|---|---|
| 5,234,529 | A * | 8/1993 | Johnson | H05H 1/46 204/298.34 |
| 6,626,998 | B1 * | 9/2003 | Dunham | C23C 16/45565 118/723 R |
| 6,780,759 | B2 * | 8/2004 | Farrens | C04B 37/00 438/657 |
| 8,240,271 | B2 * | 8/2012 | Suda | H01J 37/32559 118/723 R |
| 8,518,182 | B2 * | 8/2013 | Ogawa | C23C 16/45578 118/723 MR |
| 8,555,808 | B2 * | 10/2013 | Yamamoto | H01L 21/3141 118/723 E |
| 2004/0118521 | A1 * | 6/2004 | Pancham | H01J 37/321 156/345.48 |
| 2010/0055927 | A1 | 3/2010 | Hirose et al. | |
| 2010/0130009 | A1 * | 5/2010 | Ishimaru | C23C 16/52 156/345.43 |
| 2014/0073146 | A1 * | 3/2014 | Okada | C23C 16/45546 118/728 |
| 2014/0087587 | A1 * | 3/2014 | Lind | H01J 37/32532 439/527 |
| 2014/0178604 | A1 * | 6/2014 | Selwyn | H01J 37/32422 118/723 ER |
| 2015/0107517 | A1 * | 4/2015 | Hasebe | C23C 16/452 118/723 R |
| 2017/0256383 | A1 * | 9/2017 | Liao | H01J 37/32082 |
| 2019/0071778 | A1 * | 3/2019 | Thomas | C23C 16/4586 |

FOREIGN PATENT DOCUMENTS

| | | | |
|---|---|---|---|
| JP | 2009253013 | * | 10/2009 |
| JP | 2010-62230 | A | 3/2010 |
| JP | 2012-094652 | A | 5/2012 |

* cited by examiner

SUBSTRATE PROCESSING APPARATUS

CROSS-REFERENCE TO RELATED PATENT APPLICATION

This non-provisional U.S. patent application claims priority under 35 U.S.C. § 119 of Japanese Patent Application No. 2019-173903, filed on Sep. 25, 2019, in the Japanese Patent Office, the entire contents of which are hereby incorporated by reference.

BACKGROUND

1. Field

The present disclosure relates to a substrate processing apparatus and a method of manufacturing a semiconductor device, and more particularly, to a substrate processing apparatus and a method of manufacturing a semiconductor device configured to process a substrate using plasma.

2. Description of the Related Art

In manufacturing processes of a semiconductor device, according to some related arts, a film-forming process of depositing a predetermined film on a substrate may be performed by using a CVD (Chemical Vapor Deposition) method or an ALD (Atomic Layer Deposition) method using plasma. The CVD method refers to a method of depositing a film, whose constituent elements are those contained in molecules of a source gas, on a substrate to be processed using a chemical reaction such as a gas phase reaction of a gaseous source and a reaction on a surface of the substrate. According to the CVD method, for example, a plurality of types of source gases containing a plurality of elements constituting the film to be formed are simultaneously supplied onto the substrate to be processed to form the film. According to the ALD method, a plurality of types of source gases containing a plurality of elements constituting the film to be formed are alternately supplied onto the substrate to be processed to form the film. According to the ALD method, it is possible to control the film-forming process at an atomic layer level. In addition, the plasma may be used to promote the chemical reaction of the film deposited by the CVD method, to remove impurities from the film, or to assist the chemical reaction of the source for the film-forming process adsorbed by the ALD method. According to other related arts, a silicon nitride film such as $Si_3N_4$ film may be formed by using a film-forming technique such as the CVD method and the ALD method described above.

As the semiconductor device is miniaturized in a stepwise manner, the film should be formed at a lower substrate temperature. When the film is formed, a high frequency power capable of forming the plasma may be adjusted to optimize film-forming conditions. However, when the high frequency power becomes large, a reaction tube and an electrode may be severely damaged, and the plasma may not be stably generated.

SUMMARY

Described herein is a technique capable of reducing a damage to a reaction tube and an electrode when processing a substrate using plasma as well as generating the plasma stably.

According to one aspect of the technique of the present disclosure, there is provided a substrate processing apparatus including: a process chamber in which a substrate is processed; a buffer chamber in which a gas is circulated before being supplied to the substrate; a pair of discharge electrodes extending substantially parallel to each other in the buffer chamber; and a pair of sheath tubes, each of which is made of an insulator, configured to cover the pair of the discharge electrodes, respectively, to prevent the pair of the discharge electrodes from being exposed to the gas, wherein a metal cap, whose outer diameter is substantially equal to an outer diameter of each of the discharge electrodes and whose front end is rounded, is provided at one end of one or each of the discharge electrodes other than the other end of the one or each of the discharge electrodes supplied with electric power.

DETAILED DESCRIPTION

Figure 7A:
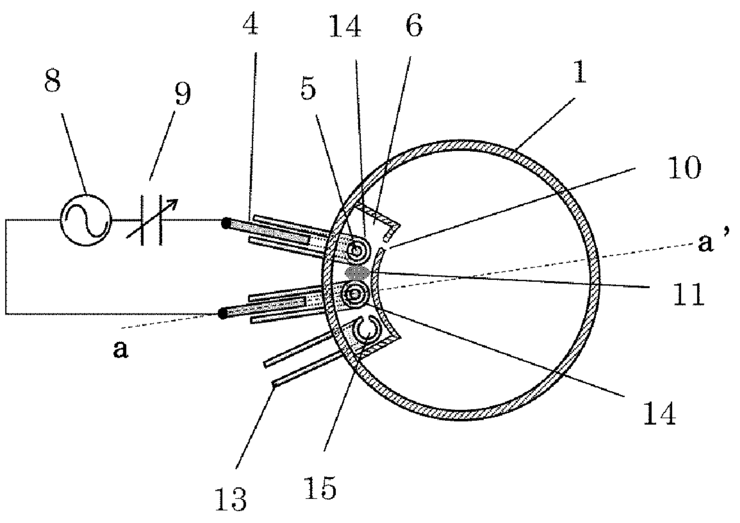
FIGS. 7A and 7B schematically illustrate cross-sections of main configurations of a substrate processing apparatus according to a comparative example.
Figure 7B:
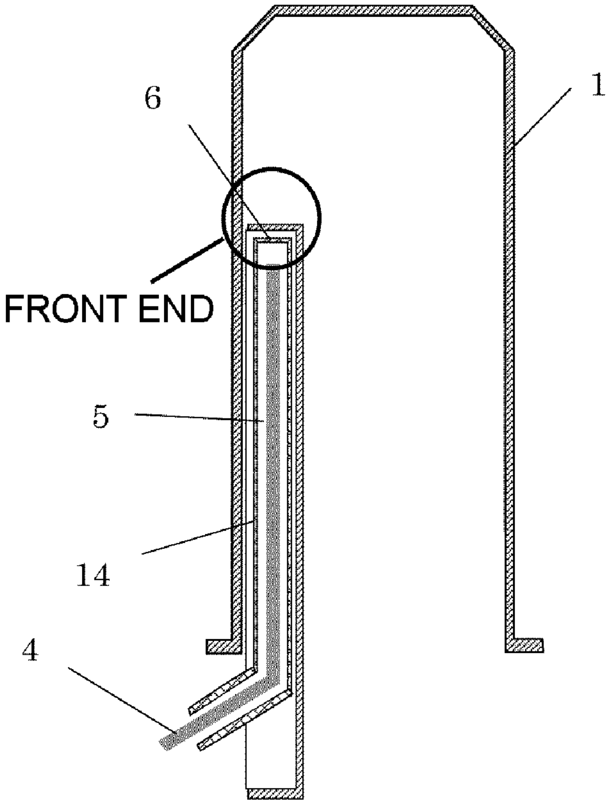
Figure 7C:
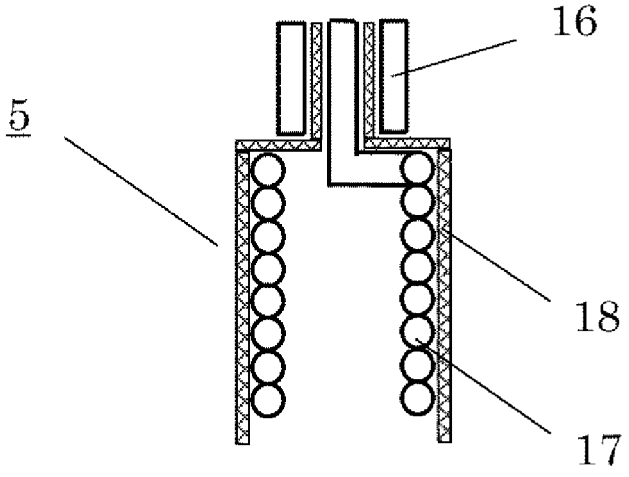
FIG. 7C schematically illustrates a configuration of a front end of a discharge electrode of the substrate processing apparatus according to the comparative example.

Hereinafter, one or more embodiments (also simply referred to as "embodiments") according to the technique of the present disclosure will be described with reference to the drawings. For better understanding of the technique described herein, first, problems in a configuration according to a comparative example will be described with reference to FIGS. 7A through 7C. FIG. 7A schematically illustrates a cross-section of a reaction chamber of a substrate processing apparatus according to the comparative example when viewed from above, and FIG. 7B schematically illustrates a vertical cross-section taken along the line a-a' of the reaction chamber of the substrate processing apparatus according to the comparative example shown in FIG. 7A. FIG. 7C is an enlarged view of a front end of a discharge electrode of the substrate processing apparatus according to the comparative example shown in the horizontal cross-section taken along the line a-a' of the reaction chamber.

As shown in FIGS. 7A and 7B, a thin and long buffer chamber 6 is provided in a vertical direction in the vicinity of a wall surface in a reaction tube 1 where the reaction chamber is provided. In the buffer chamber 6, a pair of discharge electrodes including a discharge electrode 5 (hereinafter also referred to as "discharge electrodes 5"), each of which is covered with a sheath tube 14 made of a dielectric material, and a gas nozzle 15 configured to form a uniform gas flow in the buffer chamber 6 are provided. A high frequency power generated by an oscillator 8 is applied to end portions 4 of the pair of the discharge electrodes to generate plasma 11 between the pair of the discharge electrodes in the buffer chamber 6, a reactive gas supplied through the gas nozzle 15 is excited by the plasma 11, and the exited reactive gas is supplied onto a substrate to be processed (not shown) in the reaction chamber through a plurality of small holes 10 provided at a wall of the buffer chamber 6.

As shown in FIG. 7C, for example, the discharge electrode 5 is implemented by a coil-shaped structure 17 densely wound and a wire braid 18 made of a refractory metal (that is, a metal whose melting point is high) provided outside the coil-shaped structure 17. In addition, as shown in FIG. 7C, the coil-shaped structure 17 inside the discharge electrode 5 and the wire braid made of the refractory metal outside the coil-shaped structure 17 are preferably fixed at both ends of the discharge electrode 5, and then a sleeve 16 of a tube shape covers the wire braid 18 to caulk the wire braid 18 and the coil-shaped structure 17. Then, a redundant portion of the sleeve 16 is cut out to form the discharge electrode 5. However, since a cut surface of the sleeve 16 may be sharp, during a discharge, a high frequency voltage may be concentrated on the cut surface of the sleeve 16 of the discharge electrode 5. As a result, the sheath tube 14 which is a dielectric tube may be severely damaged, and minute through-holes may be formed. Therefore, a life of the reaction tube 1 may be shortened.

Hereinafter, the embodiments according to the technique capable of addressing the problems of the substrate processing apparatus according to the comparative example described above will be described with reference to the drawings.

First Embodiment

According to a first embodiment of the technique, there is provided a substrate processing apparatus including: a buffer chamber in which a gas is circulated before being supplied to the substrate; a pair of discharge electrodes extending substantially parallel to each other in the buffer chamber; and a pair of sheath tubes, each of which is made of an insulator, configured to cover the pair of the discharge electrodes, respectively, to prevent the pair of the discharge electrodes from being exposed to the gas. A metal cap, whose outer diameter is substantially equal to an outer diameter of each of the discharge electrodes and whose front end is rounded, is provided at one end of one or each of the discharge electrodes other than the other end of the one or each of the discharge electrodes supplied with electric power.

Figure 1A:
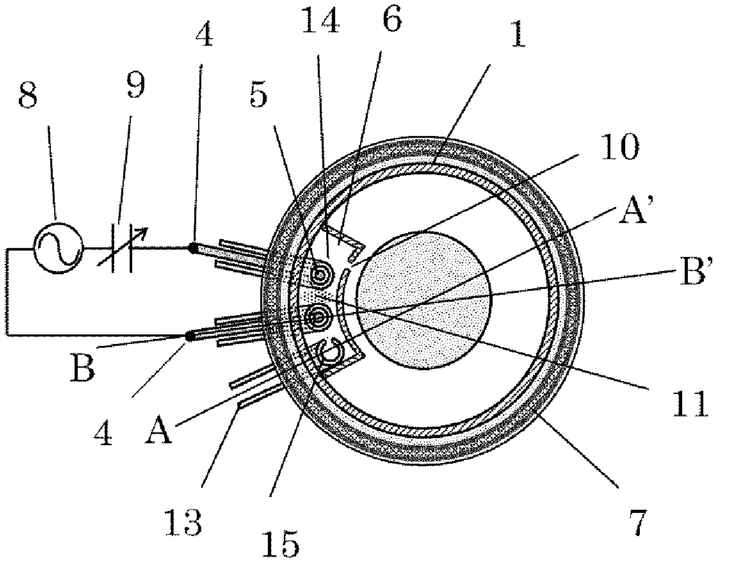
FIGS. 1A through 1C schematically illustrate cross-sections of main configurations of a substrate processing apparatus according to a first embodiment described herein.
Figure 1B:
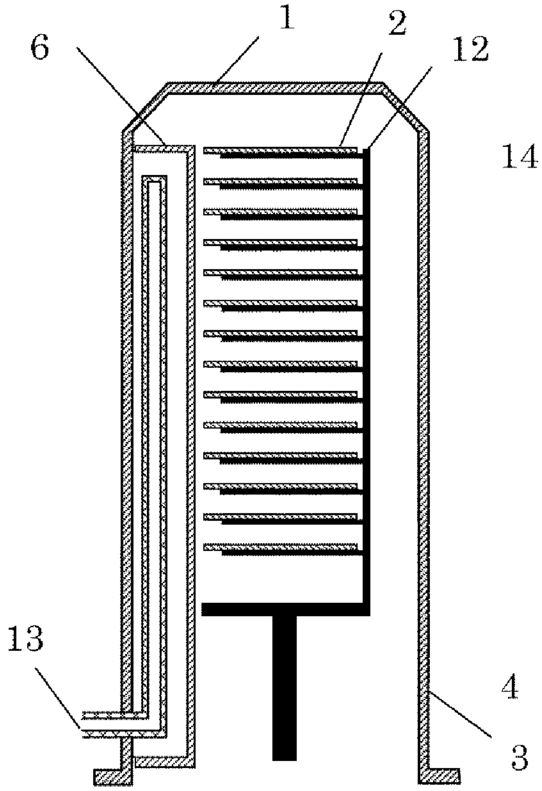
Figure 1C:
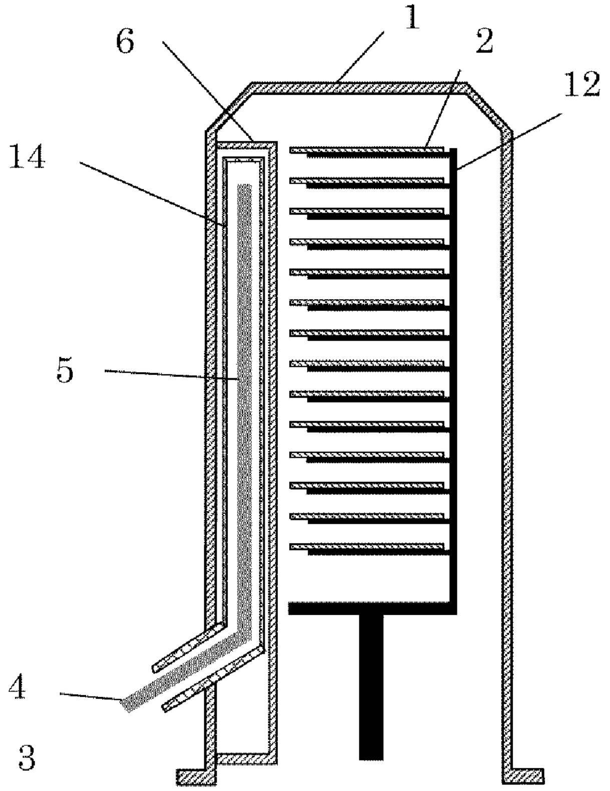

The substrate processing apparatus according to the first embodiment will be described with reference to FIGS. 1A, 1B, 1C and 1D. FIGS. 1A through 1C schematically illustrate cross-sections of the substrate processing apparatus according to the first embodiment. In particular, FIG. 1A schematically illustrates a cross-section of main configurations (in particular, a reaction chamber) of the substrate processing apparatus according to the first embodiment when viewed from above, FIG. 1B schematically illustrates a vertical cross-section taken along the line A-A' of the substrate processing apparatus according to the first embodiment in FIG. 1A, and FIG. 1C schematically illustrates a vertical cross-section taken along the line B-B' of the substrate processing apparatus according to the first embodiment in FIG. 1A.

As shown in FIG. 1A, a boat 12 is provided in a reaction tube 1. A plurality of substrates including a substrate 2 to be processed may be placed on the boat 12 in a multistage manner at the same intervals. The boat 12 may be transferred (loaded) into or transferred (unloaded) out of the reaction tube 1 by an elevator (not shown). In addition, in order to improve a uniformity of a substrate processing, a rotator (not shown) configured to rotate the boat 12 is provided.

A thin and long buffer chamber 6 is provided in a vertical direction in the vicinity of a wall surface in the reaction tube 1 where the reaction chamber is provided. In the buffer chamber 6, a pair of discharge electrodes including a discharge electrode 5, each of which is covered with a pair of sheath tubes including a sheath tube 14 made of a dielectric material, and a gas nozzle 15 configured to form a uniform gas flow in the buffer chamber 6 are provided. That is, the gas nozzle 15 is provided in the reaction tube 1 in parallel with an arrangement direction of the plurality of the substrates including the substrate 2 to be processed, and a first gas is supplied through the gas nozzle 15.

As shown in of FIG. 1B, a gas introduced through a gas introduction port 13 is supplied into the buffer chamber 6 through the gas nozzle 15. By covering the discharge electrode 5 with the sheath tube 14 which is a dielectric tube, it is possible to prevent the plasma 11 from contacting a surface of the discharge electrode 5. In addition, it is also possible to protect the surface of the discharge electrode 5 from plasma sputtering, and to prevent a metal contamination from affecting the substrate 2 to be processed. As shown in FIGS. 1A and 1C, an end portion 4 of the discharge electrode 5 extends to an outside of the sheath tube 14 which is a dielectric tube in order to supply electric power to the discharge electrode 5. As shown in FIG. 1C, a portion of the sheath tube 14 is bent to guide the discharge electrode 5 to the outside of the sheath tube 14.

By using a refractory metal such as tungsten, molybdenum, tantalum and nickel as the discharge electrode 5, it is possible to prevent deterioration thereof. That is, it is possible to provide the discharge electrode 5 in the sheath tube 14 (which is a protective tube) made of a dielectric material to be heated to the same temperature as the substrate 2 to be processed. As shown in FIG. 1A, a high frequency power generated by the oscillator 8 is applied to the end portion 4 of the discharge electrode 5 through a matcher 9.

Figure 1D:
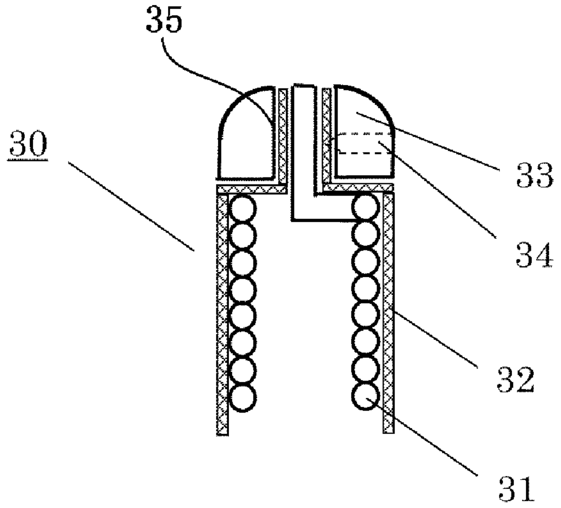
FIG. 1D schematically illustrates a configuration of a cap at a front end of a discharge electrode of the substrate processing apparatus according to the first embodiment described herein.

As shown in FIG. 1D, a discharge electrode 30 (which constitutes each of the discharge electrodes 5) of the present embodiment is constituted by a core material 31 of a coil-shaped structure and a wire braid 18 made of a refractory metal whose melting point is high and provided outside the core material 31. Thereby, the discharge electrode 30 is configured to be flexible. A cap 33 whose outer diameter is substantially equal to that of the discharge electrode 30 and whose front end is rounded is made of a metal, and is provided at an end portion of the discharge electrode 30. The cap 33 is made of a refractory metal and is configured to crimp and fix the core material 31 and the wire braid 32 together. The core material 31 is configured by forming a metal wire into a coil shape, and the cap 33 is made of a refractory metal such as tungsten, molybdenum, tantalum and nickel. An outer diameter of the wire braid 32 in an unconfined state is substantially equal to or greater than an inner diameter of the sheath tube 14, and both ends of the wire braid 32 may be pressed and fixed to the core material 31 while a predetermined tension is applied to the wire braid 32. When inserted into the sheath tube 14, the wire braid 32 can be fit to an inner surface of the sheath tube 14. As a result, the discharge electrode 5 and the sheath tube 14 come into close contact with each other, or a constant gap therebetween is provided so as to easily generate uniform plasma in a longitudinal direction. In addition to the metal wire of the coil-shaped structure, the core material 31 may also be provided with a straight metal wire configured to penetrate a center of the core material 31 in order to secure an accurate length of the core material 31.

As shown in FIG. 1D, the cap 33 is of a shape of a solid of revolution like a bullet whose maximum diameter is substantially the same as an outer diameter of the discharge electrode 30. A through-hole 35 penetrating along a rotation axis (symmetry axis) of the solid of revolution is provided in the cap 33. That is, a front end of the cap 33 is rounded. The core material 31 (which is the coil-shaped structure) and the wire braid 32 provided outside the core material 31 are inserted into the through-hole 35 of the cap 33, and are fixed by a set screw screwed into a tap hole 34 penetrating between a side surface of the cap 33 and the through-hole 35. In addition, the cap 33 itself is also fixed to a front end position of the discharge electrode 30.

As described above, by covering a projection of the discharge electrode 30 with the cap 33 configured to cover the front end of the discharge electrode 30 of the substrate processing apparatus according to the present embodiment, it is possible to provide a substrate processing apparatus capable of preventing the high frequency voltage from being concentrated, reducing a damage to the sheath tube 14 made of a dielectric material and stably generating the plasma.

According to the substrate processing apparatus of the present embodiment whose main configurations are shown in FIGS. 1A through 1D, the boat 12 is lowered by the elevator (not shown) to place the substrate 2 to be treated on the boat 12, and then the boat 12 is elevated so as to insert the boat 12 into the reaction tube 1. Subsequently, a heater (not shown) is turned on to heat components, such as the reaction tube 1, the boat 12 inserted in the reaction tube 1 and the substrate 2 to be processed accommodated in the boat 12, to a predetermined temperature. When heating the components such as the reaction tube 1, an inner atmosphere of the reaction tube 1 is exhausted by a pump (not shown). When a temperature of each component inside the reaction tube 1 reaches a predetermined temperature, the gas used to process the substrate 2 to be processed is introduced into the gas introduction port 13 while rotating the boat 12. An inner pressure of the reaction tube 1 is adjusted by a pressure regulator (not shown). When the inner pressure of the reaction tube 1 reaches a predetermined pressure, the high frequency power output from the oscillator 8 is supplied to the end portion 4 of the discharge electrode 5 through the matcher 9. As a result, the plasma 11 is generated inside the buffer chamber 6, and the gas and activated particles are supplied to the substrate 2 to be processed through the plurality of the small holes 10 provided in the buffer chamber 6 so as to process the substrate 2 to be processed.

Subsequently, as a specific example of the substrate processing apparatus of the first embodiment, a configuration and operations of a remote plasma processing apparatus will be described with reference to FIGS. 2 through 6. That is, the remote plasma processing apparatus configured to collectively process a plurality of substrates to be processed placed in a reaction chamber will be described as the specific example of the substrate processing apparatus of the first embodiment. According to the remote plasma processing apparatus, a space for generating the plasma is provided in a reaction furnace (which is a process furnace) in which the plurality of the substrates to be processed are loaded. Using an electrically neutral active species generated by the plasma generated in the space, the plurality of the substrates to be processed are simultaneously processed. In addition, the remote plasma processing apparatus uses a discharge electrode configured to generate the plasma and made of a refractory metal that does not easily deteriorate at a process temperature of the plurality of the substrates to be processed. In addition, a structure configured such that an electric field concentration is unlikely to occur is provided at a front end of the discharge electrode used in the remote plasma processing apparatus.

Figure 2:
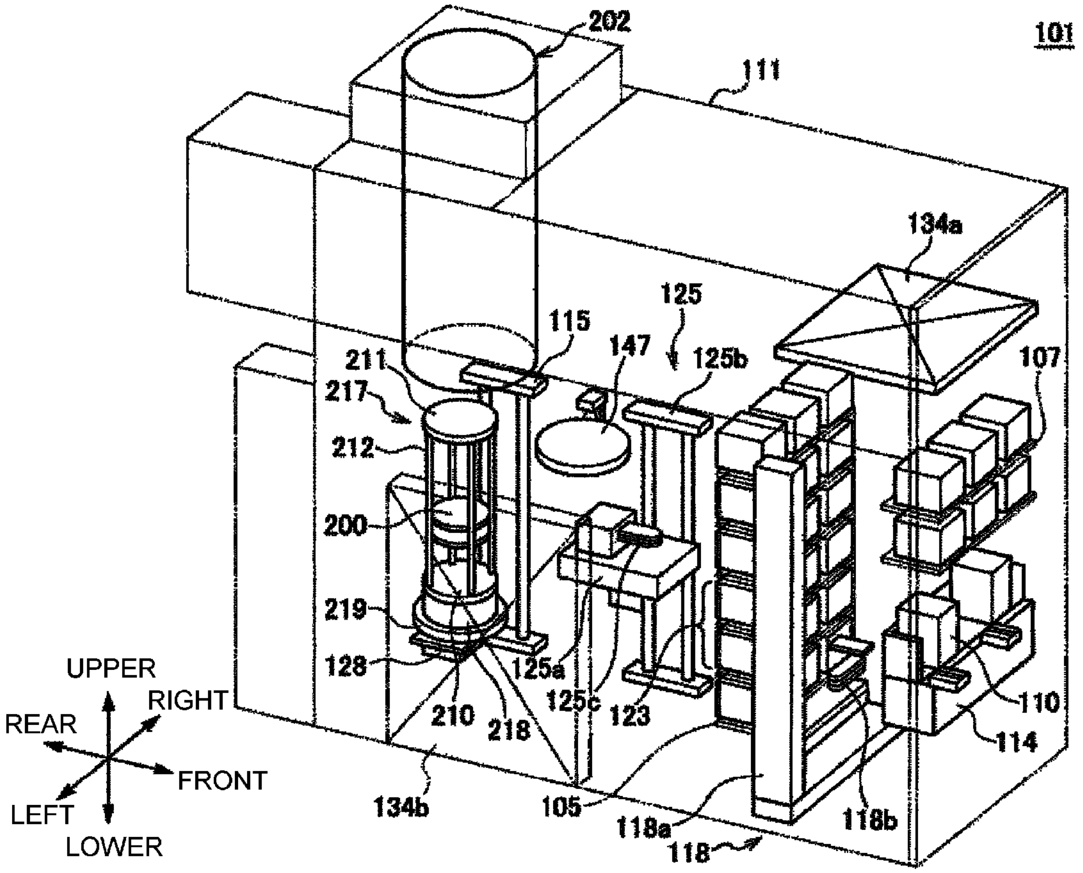
FIG. 2 is an oblique perspective view schematically illustrating a configuration of a remote plasma processing apparatus according to the first embodiment described herein.

As shown in FIG. 2, a cassette 110 configured to accommodate a plurality of wafers including a wafer 200 is used in a remote plasma processing apparatus 101. Hereinafter, the remote plasma processing apparatus 101 may also be referred to as a substrate processing apparatus 101. The wafer 200 serves as an example of the substrate, and is made of a material such as semiconductor silicon. The substrate processing apparatus 101 includes a housing 111, and a cassette stage 114 is installed in the housing 111. The cassette 110 may be loaded onto or unloaded from the cassette stage 114 by an in-process transfer apparatus (not shown).

The cassette 110 is placed on the cassette stage 114 by the in-process transfer apparatus so that the plurality of the wafers including the wafer 200 in the cassette 110 are held in a vertical orientation and a wafer loading/unloading port of the cassette 110 faces upward. The cassette stage 114 is configured to rotate the cassette 110 clockwise toward a rear side of the housing 111 by 90° in the vertical direction such that the plurality of the wafers are held in a horizontal orientation and the wafer loading/unloading port of the cassette 110 faces the rear side of the housing 111.

A cassette shelf 105 is provided at a substantially center portion in a front-rear direction in the housing 111. The cassette shelf 105 is configured to hold a plurality of cassettes including the cassette 110 in a plurality of stages and a plurality of rows. A transfer shelf 123 configured to accommodate the cassette 110 to be transferred by a cassette transfer device 118 is provided at the cassette shelf 105.

A spare cassette shelf 107 is provided above the cassette stage 114, and is configured to store the cassette 110 for preparation. The cassette transfer device 118 is provided between the cassette stage 114 and the cassette shelf 105. The cassette transfer device 118 may include a cassette elevator 118*a* configured to elevate and lower the cassette 110 while supporting the cassette 110 and a cassette transfer structure 118*b* serving as a transfer device. The cassette transfer device 118 is configured to transfer the cassette 110 among the cassette stage 114, the cassette shelf 105 and the spare cassette shelf 107 in cooperation with of the cassette elevator 118*a* and the cassette transfer structure 118*b*.

A wafer transfer device 125 is provided behind the cassette shelf 105. For example, the wafer transfer device 125 is constituted by a wafer transfer structure 125*a* and a wafer transfer structure elevator 125*b*. The wafer transfer structure 125*a* is configured to rotate or move the wafer 200 horizontally. The wafer transfer structure elevator 125*b* is configured to elevate and lower the wafer transfer structure 125*a*. The wafer transfer device 125 may load or unload the wafer 200 placed on tweezers 125*c* serving as a support for the wafer 200 into or out of a boat 217 in cooperation with the wafer transfer structure 125*a* and the wafer transfer structure elevator 125*b*.

A process furnace 202 in which the wafer 200 is processed by heat (that is, a heat treatment process is performed) is provided above a rear region of the housing 111, and a lower end of the process furnace 202 is configured to be opened and closed by a furnace opening shutter 147. A boat elevator 115 configured to elevate and lower the boat 217 with respect to the process furnace 202 is provided below the process furnace 202. An arm 128 is connected to an elevating table (not shown) of the boat elevator 115. A seal cap 219 is provided horizontally at the arm 128. The seal cap 219 is configured to support the boat 217 vertically and to close the lower end of the process furnace 202.

A clean air supply structure (which is a clean air supply device) 134*a* is provided above the cassette shelf 105. The clean air supply structure 134*a* is configured to supply clean air such as a clean atmosphere. For example, the clean air supply structure 134*a* is constituted by a supply fan (not shown) and a dust-proof filter (not shown), and is configured to circulate the clean air in the housing 111. A clean air supply structure (which is a clean air supply device) 134*b* configured to supply the clean air is provided at a left end of the housing 111. For example, the clean air supply structure 134*b* is constituted by a supply fan (not shown) and a dust-proof filter (not shown), and is configured to circulate the clean air in the vicinity of components such as the wafer transfer structure 125*a* and the boat 217. After the clean air is circulated in the vicinity of the components such as the wafer transfer structure 125*a* and the boat 217, the clean air is exhausted to an outside of the housing 111.

Subsequently, main operations of the substrate processing apparatus 101 shown in FIG. 2 will be described. When the cassette 110 is loaded onto the cassette stage 114 by the in-process transfer apparatus (not shown), the cassette 110 is placed on the cassette stage 114 so that the plurality of the wafers including the wafer 200 in the cassette 110 are held in the vertical orientation and the wafer loading/unloading port of the cassette 110 faces upward. Then, the cassette stage 114 rotates the cassette 110 clockwise toward the rear side of the housing 111 by 90° in the vertical direction such that the plurality of the wafers are held in the horizontal orientation and the wafer loading/unloading port of the cassette 110 faces the rear side of the housing 111.

Thereafter, the cassette 110 is automatically transferred to and temporarily stored in a designated shelf position among the cassette shelf 105 and the spare cassette shelf 107 by the cassette transfer device 118. The cassette 110 is then transferred toward the transfer shelf 123 from the designated shelf position among the cassette shelf 105 and the spare cassette shelf 107 by the cassette transfer device 118. Alternatively, the cassette 110 may be directly transferred toward the transfer shelf 123.

After the cassette 110 is transferred to the transfer shelf 123, the wafer 200 is then transferred out of the cassette 110 by the tweezers 125*c* of the wafer transfer structure 125*a* through the wafer loading/unloading port of the cassette 110, and loaded into the boat 217 (wafer charging). The wafer transfer structure 125*a* then returns to the cassette 110 and transfers a next wafer among the plurality of the wafers from the cassette 110 into the boat 217.

After a predetermined number of wafers including the wafer 200 are charged into the boat 217, the furnace opening shutter 147 is opened to open the lower end of the process furnace 202 closed by the furnace opening shutter 147. Then, the boat 217 accommodating the plurality of the wafers including the wafer 200 is transferred into the process furnace 202 by an elevating operation of the boat elevator 115, and the lower end of the process furnace 202 is closed by the seal cap 219. After the boat 217 is loaded into the process furnace 202, a predetermined processing is performed to the plurality of the wafers including the wafer 200.

Figure 3:
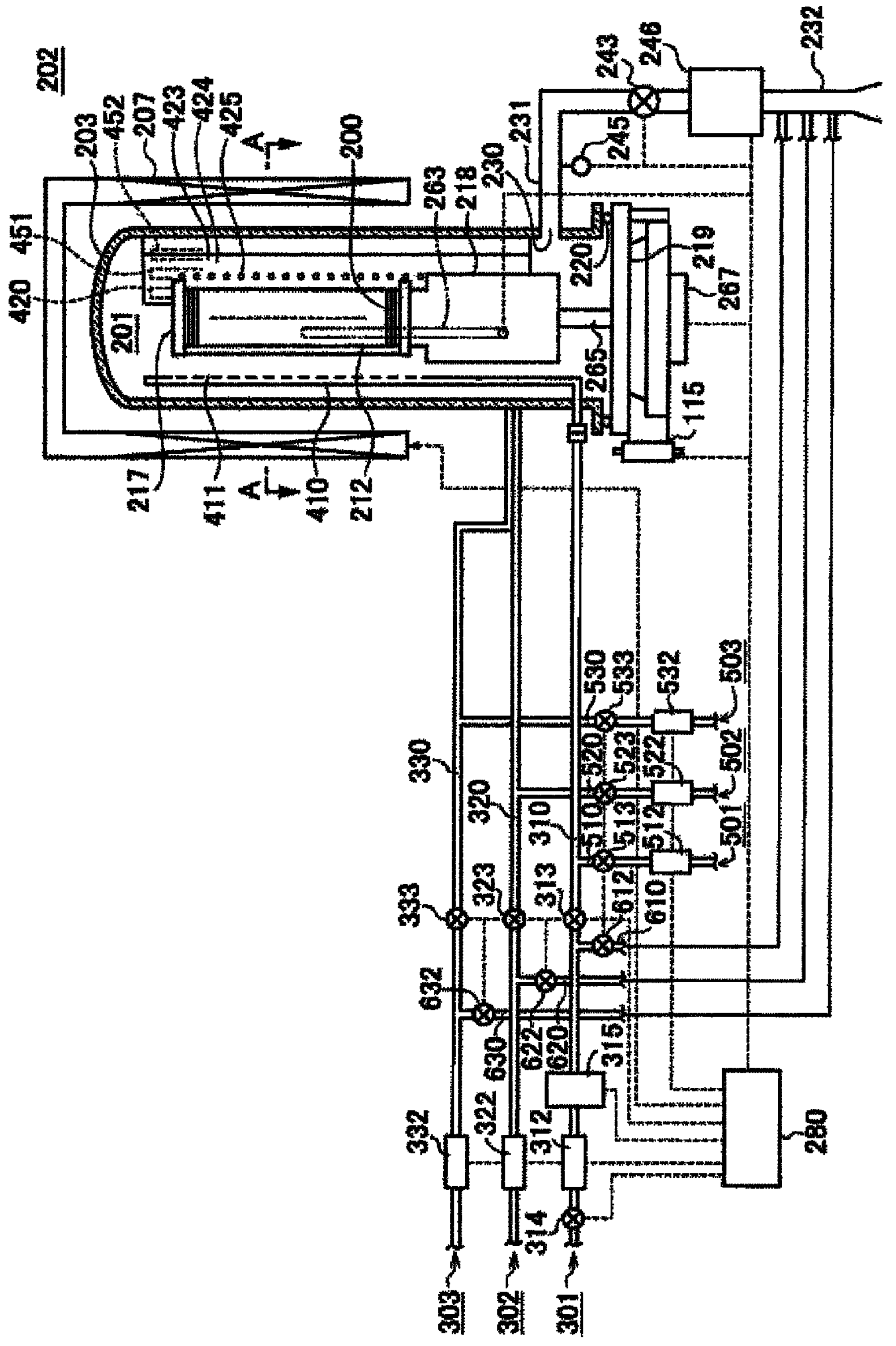
FIG. 3 schematically illustrates a vertical cross-section of a process furnace of the remote plasma processing apparatus according to the first embodiment described herein.
Figure 4:
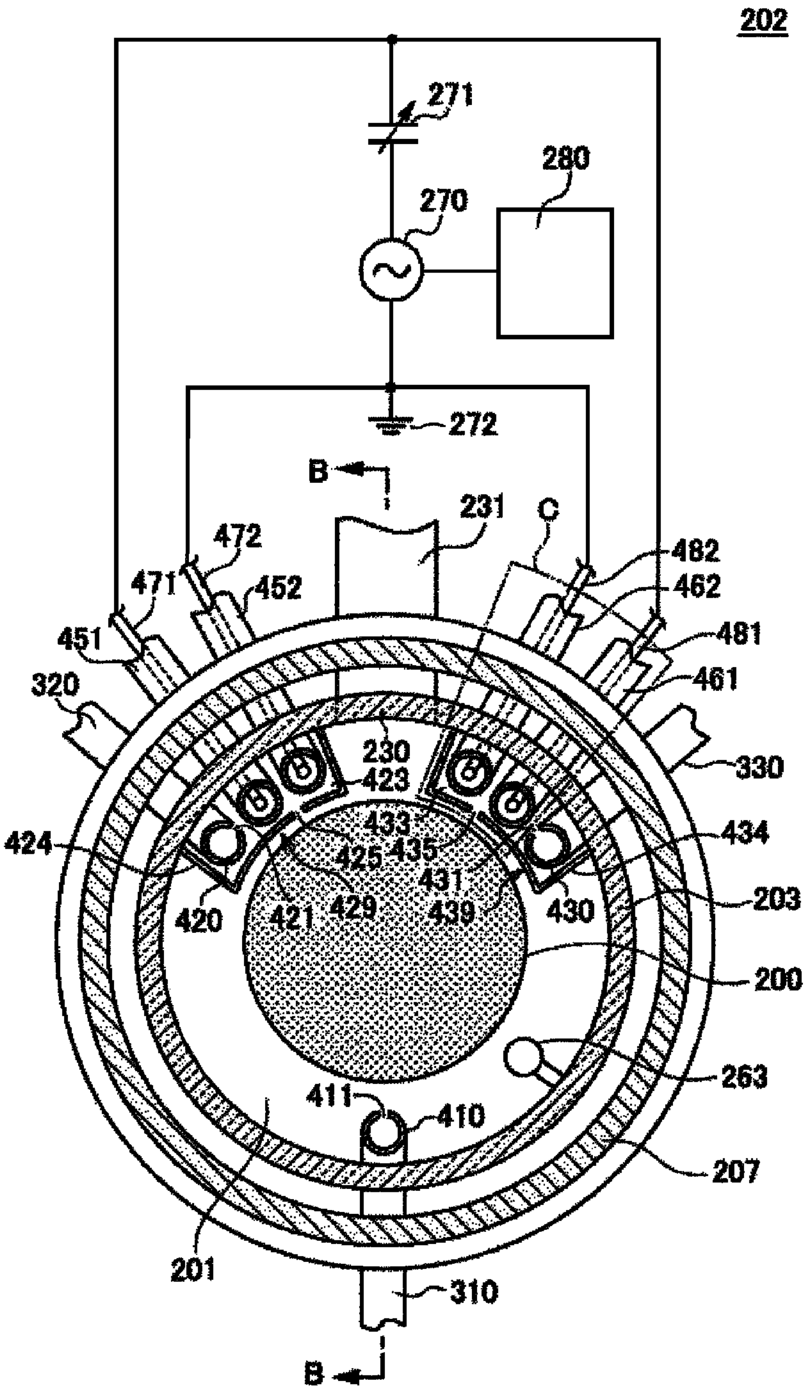
FIG. 4 schematically illustrates a horizontal cross-section taken along the line A-A of the process furnace of the remote plasma processing apparatus according to the first embodiment shown in FIG. 3.

Subsequently, the process furnace 202 used in the substrate processing apparatus 101 described above will be described with reference to FIGS. 3 and 4. As shown in FIGS. 3 and 4, the process furnace 202 is provided with a heater 207 serving as a heating apparatus (heating structure) configured to heat the plurality of the wafers including the wafer 200. The heater 207 includes a cylindrical heat insulator whose upper end is closed and a plurality of heater wires provided at the heat insulator. A reaction tube 203 made of quartz and in which the plurality of the wafers including the wafer 200 are processed is provided concentrically with the heater 207. That is, the plurality of the wafers including the wafer 200 are arranged and accommodated in the reaction tube 203. The reaction tube 203 corresponds to the reaction tube 1 shown in FIG. 1A.

The seal cap 219 serving as a furnace opening lid capable of airtightly sealing a lower end opening of the reaction tube 203 is provided under the reaction tube 203. The seal cap 219 is in contact with the lower end of the reaction tube 203 from thereunder. The seal cap 219 is made of a metal such as SUS (stainless steel), and is of a disk shape. An O-ring 220 serving as a seal provided between an upper surface of the seal cap 219 and a flange of an annular shape provided at the lower end opening of the reaction tube 203 so as to airtightly seal between the upper surface of the seal cap 219 and the flange. A process chamber 201 is defined by at least the reaction tube 203 and the seal cap 219.

A boat support 218 configured to support the boat 217 is provided on the seal cap 219. The boat support 218 is made of a heat resistant material such as quartz and silicon carbide. The boat support 218 functions not only as a support capable of supporting the boat 217 but also as a heat insulator. The boat 217 is provided vertically on the boat support 218. For example, the boat 217 is made of a heat resistant material such as quartz and silicon carbide. The boat 217 includes a bottom plate 210 fixed to the boat support 218 and a top plate 211 provided above the bottom plate 210. A plurality of support columns 212 are provided between the bottom plate 210 and the top plate 211. The plurality of the support columns 212 are installed to connect the bottom plate 210 and the top plate 211 (refer to FIG. 2). The boat 217 accommodates the plurality of the wafers including the wafer 200. The plurality of the wafers are horizontally oriented with predetermined intervals therebetween. That is, the plurality of the wafers are supported by the plurality of the support columns 212 of the boat 217 with their centers aligned with each other in a multi stage manner. A stacking direction of the plurality of the wafers is equal to an axial direction of the reaction tube 203.

A boat rotator 267 configured to rotate the boat 217 is provided at the seal cap 219 opposite to the process chamber 201. A rotating shaft 265 of the boat rotator 267 is connected to the boat support 218 through the seal cap 219. As the boat rotator 267 rotates the boat 217 via the boat support 218, the plurality of the wafers including the wafer 200 supported by the boat 217 are rotated.

The seal cap 219 may be elevated or lowered in the vertical direction by the boat elevator 115 provided outside the reaction tube 203. The boat elevator 115 serves as an elevator. As the seal cap 219 is elevated or lowered in the vertical direction by the boat elevator 115, the boat 217 is transferred into or out of the process chamber 201.

In the process furnace 202 described above, with the plurality of the wafers including the wafer 200 to be batch-processed stacked in the boat 217 in a multistage manner, the boat 217 is inserted into the process chamber 201 while being supported by the boat support 218. The heater 207 heats the plurality of the wafers inserted in the process chamber 201 to a predetermined temperature.

As shown in FIGS. 3 and 4, for example, there are provided gas supply pipes 310, 320 and 330 configured to supply the gas such as a source gas. Nozzles 410, 420 and 430 are provided in the process chamber 201. The nozzles 410, 420 and 430 are provided so as to penetrate a lower portion of the reaction tube 203. The gas supply pipe 310 is connected to the nozzle 410, the gas supply pipe 320 is connected to the nozzle 420 and the gas supply pipe 330 is connected to the nozzle 430.

A valve 314 serving as an opening/closing valve, a liquid mass flow controller 312 serving as a flow rate controller for a liquid source, a vaporizer 315 serving as a vaporizing structure (vaporizing apparatus) and a valve 313 serving as an opening/closing valve are sequentially provided at the gas supply pipe 310 in order from an upstream side to a downstream side of the gas supply pipe 310.

A downstream end of the gas supply pipe 310 is connected to an end of the nozzle 410. The nozzle 410 is installed in a space of an arc shape between an inner wall of the reaction tube 203 and the plurality of the wafers including the wafer 200 accommodated in the process chamber 201 to extend from a lower portion to an upper portion of the inner wall of the reaction tube 203 along the stacking direction of the plurality of the wafers including the wafer 200. The nozzle 410 may be implemented as an L-shaped nozzle. A plurality of gas supply holes 411 configured to supply the gas such as the source gas are provided on a side surface of the nozzle 410. The plurality of the gas supply holes 411 are open toward a center of the reaction tube 203. An opening area of each of the gas supply holes 411 may be the same, or may be increased or decreased as it goes from the lower portion to the upper portion of the inner wall of the reaction tube 203. The plurality of the gas supply holes 411 are provided with the same opening pitch therebetween.

In addition, a valve 612 and a vent line 610 connected to an exhaust pipe 232 described later are provided at the gas supply pipe 310 between the valve 313 and the vaporizer 315.

A gas supply system 301 is constituted mainly by the gas supply pipe 310, the valve 314, the liquid mass flow controller 312, the vaporizer 315, the valve 313, the nozzle 410, the vent line 610 and the valve 612.

A carrier gas supply pipe 510 configured to supply a carrier gas (inert gas) is connected to the gas supply pipe 310 at a downstream side of the valve 313. A mass flow controller 512 and a valve 513 are provided at the carrier gas supply pipe 510. A carrier gas supply system (also referred to as an “inert gas supply system”) 501 is constituted mainly by the carrier gas supply pipe 510, the mass flow controller 512 and the valve 513.

In the gas supply pipe 310, a flow rate of the liquid source is adjusted by the liquid mass flow controller 312, and the liquid source whose flow rate is adjusted is supplied to the vaporizer 315 and vaporized. The vaporized liquid source is then supplied as the source gas. While the source gas is not supplied to the process chamber 201, with the valve 313 closed and the valve 612 open, the source gas is made to flow to the vent line 610 through the valve 612.

When the source gas is supplied to the process chamber 201, with the valve 612 closed and the valve 313 open, the source gas is supplied to the gas supply pipe 310 at the downstream of the valve 313. In addition, a flow rate of the carrier gas is adjusted by the mass flow controller 512, and the carrier gas whose flow rate is adjusted is supplied through the carrier gas supply pipe 510 via the valve 513. The source gas joins the carrier gas at the downstream side of the valve 313, and the source gas together with the carrier gas is supplied to the process chamber 201 through the nozzle 410. A mass flow controller 322 serving as a flow rate controller and a valve 323 serving as an opening/closing valve are sequentially provided at the gas supply pipe 320 in order from an upstream side to a downstream side of the gas supply pipe 320.

A downstream end of the gas supply pipe 320 is connected to an end of the nozzle 420. The nozzle 420 is provided in a buffer chamber 423 serving as a gas dispersion space (also referred to as a “discharge chamber” or a “discharge space”). Electrode protection pipes 451 and 452 described later are provided in the buffer chamber 423. The nozzle 420, the electrode protection pipe 451 and the electrode protection pipe 452 are arranged in this order in the buffer chamber 423.

The buffer chamber 423 is defined by the inner wall of the reaction tube 203 and a buffer chamber wall 424. The buffer chamber wall 424 is installed in the space of an arc shape between the inner wall of the reaction tube 203 and the plurality of the wafers including the wafer 200 accommodated in the process chamber 201 to extend from the lower portion to the upper portion of the inner wall of the reaction tube 203 along the stacking direction of the plurality of the wafers including the wafer 200. That is, the buffer chamber 423 may be formed as a single body with the reaction tube 203 such that a surface of the buffer chamber 423 (that is, the buffer chamber wall 424) is located adjacent to an inside of the reaction tube 203. A plurality of gas supply holes 425 configured to supply the gas such as the source gas are provided on a region of the buffer chamber wall 424 adjacent to the plurality of the wafers. The plurality of the gas supply holes 425 are provided between the electrode protection pipe 451 and the electrode protection pipe 452, and are opened toward the center of the reaction tube 203. The plurality of the gas supply holes 425 are provided from the lower portion to the upper portion of the reaction tube 203. For example, an opening area of each of the gas supply holes 425 is the same, and the plurality of the gas supply holes 425 are provided with the same opening pitch therebetween. Instead of the plurality of the gas supply holes 425, a gas supply hole (through-hole) may be provided in the region extending from the lower portion to the upper portion of the inner wall of the reaction tube 203 along the stacking direction of the plurality of the wafers.

The nozzle 420 is installed on an end of the buffer chamber 423 to extend from the lower portion to the upper portion of the inner wall of the reaction tube 203 along the stacking direction of the plurality of the wafers including the wafer 200. The nozzle 420 may serve as a gas introduction structure in communication with an inside of the buffer chamber 423. The nozzle 420 may be implemented as an L-shaped nozzle. A plurality of gas supply holes 421 configured to supply the gas such as the source gas are provided on a side surface of the nozzle 420. The plurality of the gas supply holes 421 are opened toward the center of the reaction tube 203. Similar to the plurality of the gas supply holes 425 of the buffer chamber 423, the plurality of the gas supply holes 421 are provided from the lower portion to the upper portion of the reaction tube 203. When a pressure difference between the buffer chamber 423 and the nozzle 420 is small, an opening area and an opening pitch of each of the gas supply holes 421 may be the same from an upstream side to a downstream side of the nozzle 420 (that is, from a lower portion to an upper portion of the nozzle 420). However, when the pressure difference is large, the opening area of each of the gas supply holes 421 may be gradually increased as it goes from the upstream side to the downstream side of the nozzle 420, or the opening pitch of each of gas supply holes 421 may be gradually decreased as it goes from the upstream side to the downstream side of the nozzle 420.

According to the substrate processing apparatus 101 of the present embodiment, by adjusting the opening area and the opening pitch of each of the gas supply holes 421 of the nozzle 420 from the upstream side to the downstream side of the nozzle 420 as described above, first, the gas is ejected through the plurality of the gas supply holes 421 with the substantially same flow rate but different flow velocities. Then, the gas ejected through the each of the gas supply holes 421 is introduced into the buffer chamber 423, and the flow velocities of the gas is uniformized in the buffer chamber 423.

That is, the gas ejected into the buffer chamber 423 through the plurality of the gas supply holes 421 of the nozzle 420 is ejected into the process chamber 201 through the plurality of the gas supply holes 425 of the buffer chamber 423 after velocities of particles of the gas are reduced. Thereby, flow rates and flow velocities of the gas ejected into the buffer chamber 423 through the plurality of the gas supply holes 421 of the nozzle 420 becomes uniform when being ejected into the process chamber 201 through the plurality of gas supply holes 425.

In addition, a valve 622 and a vent line 620 connected to the exhaust pipe 232 described later are provided at the gas supply pipe 320 between the valve 323 and the mass flow controller 322. A gas supply system 302 is constituted mainly by the gas supply pipe 320, the mass flow controller 322, the valve 323, the nozzle 420, the buffer chamber 423, the vent line 620 and the valve 622.

A carrier gas supply pipe 520 configured to supply the carrier gas (inert gas) is connected to the gas supply pipe 320 at a downstream side of the valve 323. A mass flow controller 522 and a valve 523 are provided at the carrier gas supply pipe 520. A carrier gas supply system (also referred to as an "inert gas supply system") 502 is constituted mainly by the carrier gas supply pipe 520, the mass flow controller 522 and the valve 523. A flow rate of the source gas in a gaseous state is adjusted by the mass flow controller 322, and the source gas whose flow rate is adjusted is supplied through the gas supply pipe 320.

While the source gas is not supplied to the process chamber 201, with the valve 323 closed and the valve 622 open, the source gas is supplied to the vent line 620 through the valve 622. When the source gas is supplied to the process chamber 201, with the valve 622 closed and the valve 323 open, the source gas is supplied to the gas supply pipe 320 at the downstream of the valve 323. In addition, a flow rate of the carrier gas is adjusted by the mass flow controller 522, and the carrier gas whose flow rate is adjusted is supplied through the carrier gas supply pipe 520 via the valve 523. The source gas joins the carrier gas at the downstream side of the valve 323, and the source gas together with the carrier gas is supplied to the process chamber 201 through the nozzle 420 and the buffer chamber 423.

A mass flow controller 332 serving as a flow rate controller and a valve 333 serving as an opening/closing valve are sequentially provided at the gas supply pipe 330 in order from an upstream side to a downstream side of the gas supply pipe 330. A downstream end of the gas supply pipe 330 is connected to an end of the nozzle 430. The nozzle 430 is provided in a buffer chamber 433 serving as a gas dispersion space (also referred to as a "discharge chamber" or a "discharge space"). Electrode protection pipes 461 and 462 described later are provided in the buffer chamber 433. The nozzle 430, the electrode protection pipe 461 and the electrode protection pipe 462 are arranged in this order in the buffer chamber 433.

The buffer chamber 433 is defined by the inner wall of the reaction tube 203 and a buffer chamber wall 434. The buffer chamber wall 434 is installed in the space of an arc shape between the inner wall of the reaction tube 203 and the plurality of the wafers including the wafer 200 accommodated in the process chamber 201 to extend from the lower portion to the upper portion of the inner wall of the reaction tube 203 along the stacking direction of the plurality of the wafers including the wafer 200. That is, the buffer chamber 433 may be formed as a single body with the reaction tube 203 such that a surface of the buffer chamber 433 (that is, the buffer chamber wall 434) is located adjacent to the inside of the reaction tube 203. A plurality of gas supply holes 435 configured to supply the gas such as the source gas are provided on a region of the buffer chamber wall 434 adjacent to the plurality of the wafers. The plurality of the gas supply holes 435 are provided between the electrode protection pipe 461 and the electrode protection pipe 462, and are opened toward the center of the reaction tube 203. The plurality of the gas supply holes 435 are provided from the lower portion to the upper portion of the reaction tube 203. For example, an opening area of each of the gas supply holes 435 is the same, and the plurality of the gas supply holes 435 are provided with the same opening pitch therebetween. Instead of the plurality of the gas supply holes 435, a gas supply hole (through-hole) may be provided in the region extending from the lower portion to the upper portion of the inner wall of the reaction tube 203 along the stacking direction of the plurality of the wafers.

The nozzle 430 is installed on an end of the buffer chamber 433 to extend from the lower portion to the upper portion of the inner wall of the reaction tube 203 along the stacking direction of the plurality of the wafers including the wafer 200. The nozzle 430 may serve as a gas introduction structure in communication with an inside of the buffer chamber 433. The nozzle 430 may be implemented as an L-shaped nozzle. A plurality of gas supply holes 431 configured to supply the gas such as the source gas are provided on a side surface of the nozzle 430. The plurality of the gas supply holes 431 are opened toward the center of the reaction tube 203. Similar to the plurality of the gas supply holes 435 of the buffer chamber 433, the plurality of the gas supply holes 431 are provided from the lower portion to the upper portion of the reaction tube 203. When a pressure difference between the buffer chamber 433 and the nozzle 430 is small, an opening area and an opening pitch of each of the gas supply holes 431 may be the same from an upstream side to a downstream side of the nozzle 430 (that is, from a lower portion to an upper portion of the nozzle 430). However, when the pressure difference is large, the opening area of each of the gas supply holes 431 may be gradually increased as it goes from the upstream side to the downstream side of the nozzle 430, or the opening pitch of each of the gas supply holes 431 may be gradually decreased as it goes from the upstream side to the downstream side of the nozzle 430.

According to the substrate processing apparatus 101 of the present embodiment, by adjusting the opening area and the opening pitch of each of the gas supply holes 431 of the nozzle 430 from the upstream side to the downstream side of the nozzle 430 as described above, first, the gas is ejected through the plurality of the gas supply holes 431 with substantially the same flow rate but different flow velocities. Then, the gas ejected through the each of the gas supply holes 431 is introduced into the buffer chamber 433, and the flow velocities of the gas are uniformized in the buffer chamber 433.

That is, the gas ejected into the buffer chamber 433 through each of the gas supply holes 431 of the nozzle 430 is ejected into the process chamber 201 through the plurality of the gas supply holes 435 of the buffer chamber 433 after particle velocities of the gas are reduced. Thereby, the flow rates and the flow velocities of the gas ejected into the buffer chamber 433 through the plurality of the gas supply holes 431 of the nozzle 430 become uniform when being ejected into the process chamber 201 through the plurality of the gas supply holes 435.

In addition, a valve 632 and a vent line 630 connected to the exhaust pipe 232 described later are provided at the gas supply pipe 330 between the valve 333 and the mass flow controller 332. A gas supply system 303 is constituted mainly by the gas supply pipe 330, the mass flow controller 332, the valve 333, the nozzle 430, the buffer chamber 433, the vent line 630 and the valve 632.

A carrier gas supply pipe 530 configured to supply the carrier gas (inert gas) is connected to the gas supply pipe 330 at a downstream side of the valve 333. A mass flow controller 532 and a valve 533 are provided at the carrier gas supply pipe 530. A carrier gas supply system (also referred to as an "inert gas supply system") 503 is constituted mainly by the carrier gas supply pipe 530, the mass flow controller 532 and the valve 533. A flow rate of the source gas in a gaseous state is adjusted by the mass flow controller 332, and the source gas whose flow rate is adjusted is supplied through the gas supply pipe 330.

While the source gas is not supplied to the process chamber 201, with the valve 333 closed and the valve 632 open, the source gas is supplied to the vent line 630 through the valve 632. When the source gas is supplied to the process chamber 201, with the valve 632 closed and the valve 333 open, the source gas is supplied to the gas supply pipe 330 at the downstream of the valve 333. In addition, a flow rate of the carrier gas is adjusted by the mass flow controller 532, and the carrier gas whose flow rate is adjusted is supplied through the carrier gas supply pipe 530 via the valve 533. The source gas joins the carrier gas at the downstream side of the valve 333, and the source gas together with the carrier gas is supplied to the process chamber 201 through the nozzle 430 and the buffer chamber 433.

In the buffer chamber 423, a rod-shaped electrode 471 and a rod-shaped electrode 472, which are formed as a thin and elongated structure, are provided from the lower portion to the upper portion of the reaction tube 203 along the stacking direction of the plurality of the wafers including the wafer 200. The rod-shaped electrodes 471 and 472 correspond to the pair of the discharge electrodes 5 each provided with the cap 33 shown in FIGS. 1A through 1D. Each of the rod-shaped electrodes 471 and 472 is provided parallel to the nozzle 420. A front end of each of the rod-shaped electrodes 471 and 472 is of a hemispherical shape similar to the discharge electrode 30. The rod-shaped electrodes 471 and 472 are covered and protected by the electrode protection pipes 451 and 452 from an upper portion to a lower portion thereof, respectively. The electrode protection pipes 451 and 452 correspond to the sheath tube 14 shown in FIG. 1A. For example, a height of the buffer chamber 433 may range from 500 mm to 1,500 mm. A length of each of the rod-shaped electrodes 471 and 472 is similar to the height of the buffer chamber 433, and is shorter than ¼ of a wavelength of the high frequency power. The rod-shaped electrode 471 is connected to a high frequency (RF: Radio Frequency) power supply 270 via a matcher 271. The rod-shaped electrode 472 is connected to an electrical ground 272 serving as a reference potential. By applying the high frequency power (that is, RF power) to the rod-shaped electrodes 471 and 472, the plasma is generated in a plasma generation region between the rod-shaped electrodes 471 and 472. A first plasma generating structure 429 is constituted mainly by the rod-shaped electrode 471, the rod-shaped electrode 472, the electrode protection pipe 451, the electrode protection pipe 452, the buffer chamber 423 and the plurality of the gas supply holes 425. In addition, a first plasma source serving as a plasma generator (plasma generation apparatus) is constituted mainly by the rod-shaped electrode 471, the rod-shaped electrode 472, the electrode protection pipe 451, the electrode protection pipe 452, the matcher 271 and the high frequency power supply 270. The first plasma source also functions as an activator capable of activating the gas into a plasma state. The buffer chamber 423 also functions as a plasma generation chamber.

In the buffer chamber 433, a rod-shaped electrode 481 and a rod-shaped electrode 482 are provided from the lower portion to the upper portion of the reaction tube 203 along the stacking direction of the plurality of the wafers including the wafer 200. Each of the rod-shaped electrodes 481 and 482 is provided parallel to the nozzle 430. The rod-shaped electrodes 481 and 482 are covered and protected by the electrode protection pipes 461 and 462 from an upper portion to a lower portion thereof, respectively. The rod-shaped electrode 481 is connected to the high frequency power supply 270 via the matcher 271. The rod-shaped electrode 482 is connected to the electrical ground 272 serving as a reference potential. A second plasma generating structure 439 is constituted mainly by the rod-shaped electrode 481, the rod-shaped electrode 482, the electrode protection pipe 461, the electrode protection pipe 462, the buffer chamber 433 and the plurality of the gas supply holes 435. In addition, a second plasma source serving as a plasma generator (plasma generation apparatus) is constituted mainly by the rod-shaped electrode 481, the rod-shaped electrode 482, the electrode protection pipe 461, the electrode protection pipe 462, the matcher 271 and the high frequency power supply 270. The second plasma source also functions as an activator capable of activating the gas into a plasma state. The buffer chamber 433 also functions as a plasma generation chamber.

In addition, the plasma generated in the substrate processing apparatus 101 of the present embodiment may also be referred to as "remote plasma". The remote plasma (that is, the plasma generated between the electrodes) is transferred to a surface of a material to be processed due to the flow of the gas to perform a plasma process. According to the present embodiment, the two rod-shaped electrodes 471 and 472 are accommodated in the buffer chamber 423, and the two rod-shaped electrodes 481 and 482 are accommodated in the buffer chamber 433. Thus, the substrate processing apparatus 101 is configured to prevent ions that may damage the wafer 200 from leaking into the process chamber 201 outside the buffer chamber 423 and the buffer chamber 433. In addition, an electric field is formed and the plasma is generated to surround the two rod-shaped electrodes 471 and 472 (that is, to surround the electrode protection pipes 451 and 452 in which the two rod-shaped electrodes 471 and 472 are accommodated), and an electric field is formed and the plasma is generated to surround the two rod-shaped electrodes 481 and 482 (that is, to surround the electrode protection pipes 461 and 462 in which the two rod-shaped electrodes 481 and 482 are accommodated). An active species contained in the plasma is supplied from an outer circumference of the wafer 200 toward a center of the wafer 200 through the plurality of the gas supply holes 425 of the buffer chamber 423 and the plurality of the gas supply holes 435 of the buffer chamber 433. In addition, in a vertical batch-type apparatus of the present embodiment in which the plurality of the wafers including the wafer 200 are stacked with their main surfaces arranged parallel to the horizontal surface, the buffer chamber 423 and the buffer chamber 433 are disposed on an inner wall surface of the reaction tube 203 (that is, in positions close to the plurality of the wafers to be processed). Therefore, the generated active species may easily reach the surface of each of the wafers without being deactivated.

As shown in FIGS. 3 and 4, an exhaust port 230 is provided at the lower portion of the reaction tube 203. The exhaust port 230 is connected to an exhaust pipe 231. The plurality of the gas supply holes 411 of the nozzle 410 and the exhaust port 230 are provided at positions facing each other with the plurality of the wafers including the wafer 200 therebetween (that is, provided opposite to the plurality of the wafers by 180 degrees). By providing the plurality of the gas supply holes 411 and the exhaust port 230 as described above, the source gas supplied through the plurality of the gas supply holes 411 flows across the main surfaces of the plurality of the wafers in the direction of the exhaust pipe 231, and the source gas is uniformly supplied to the entire surfaces of the plurality of the wafers. Thus, it is possible to easily form a more uniform film on the plurality of the wafers.

According to the present embodiment, the substrate processing apparatus 101 includes: the first plasma source constituted mainly by the rod-shaped electrode 471, the rod-shaped electrode 472, the electrode protection pipe 451, the electrode protection pipe 452, the matcher 271 and the high frequency power supply 270; and the second plasma source constituted mainly by the rod-shaped electrode 481, the rod-shaped electrode 482, the electrode protection pipe 461, the electrode protection pipe 462, the matcher 271 and the high frequency power supply 270. In order to lower the process temperature of the wafer 200 using the plasma, the high frequency power when generating the plasma should be increased. However, when the high frequency power is increased, the damage to the wafer 200 and the film to be formed will also be increased. On the other hand, in the substrate processing apparatus 101 according to the present embodiment, two plasma sources (that is, the first plasma source and the second plasma source) are provided. Therefore, even when the high frequency power supplied to the electrodes is small, it is possible to generate a sufficient amount of the plasma as compared to a case where one plasma source is provided. As a result, when the wafer 200 is processed using the plasma, it is possible to reduce the damage to the wafer 200 and the film to be formed, and also possible to lower the process temperature of the wafer 200.

As described above, the first plasma generating structure 429 is constituted mainly by the rod-shaped electrode 471, the rod-shaped electrode 472, the electrode protection pipe 451, the electrode protection pipe 452, the buffer chamber 423 and the plurality of the gas supply holes 425, and the second plasma generating structure 439 is constituted mainly by the rod-shaped electrode 481, the rod-shaped electrode 482, the electrode protection pipe 461, the electrode protection pipe 462, the buffer chamber 433 and the plurality of the gas supply holes 435. The first plasma generating structure 429 and the second plasma generating structure 439 are provided line-symmetrically with respect to a line passing through the center of the wafer 200 (the center of the reaction tube 203). Thus, it is possible to more easily supply the plasma to the entire surface of the wafer 200 from both plasma generating structures, and also possible to form a more uniform film on the wafer 200.

In addition, as shown in FIGS. 1A through 1D, each of the rod-shaped electrodes 471, 472, 481 and 482 is implemented as the electrode including the cap 33 of a curved structure configured such that the electric field concentration is unlikely to occur, it is possible to reduce the damage to the reaction tube 203 and the wafer 200, and also possible to stably generate the plasma.

Since the exhaust port 230 is also provided on the line passing through the center of the wafer 200 (the center of the reaction tube 203), it is possible to more easily supply the plasma to the entire surface of the wafer 200, and also possible to form a more uniform film on the wafer 200. In addition, since the plurality of the gas supply holes 411 of the nozzle 410 are also provided on the line passing through the center of the wafer 200 (the center of the reaction tube 203), it is possible to more easily supply the plasma to the entire surface of each of the plurality of the wafers including the wafer 200, and also possible to form a more uniform film on the surface of each of the plurality of the wafers.

In addition, since the plurality of the gas supply holes 411 of the nozzle 410, the plurality of the gas supply holes 425 and the plurality of the gas supply holes 435 are disposed such that distances between the plurality of the gas supply holes 411 of the nozzle 410 and the plurality of the gas supply holes 425 of the buffer chamber 423 are equal to distances between the plurality of the gas supply holes 411 of the nozzle 410 and the plurality of the gas supply holes 435 of the buffer chamber 433, it is possible to form a more uniform film on the surface of each of the plurality of the wafers including the wafer 200.

Referring again to FIGS. 3 and 4, the exhaust pipe 231 is connected to the exhaust port 230 provided at the lower portion of the reaction tube 203. A vacuum pump 246 serving as a vacuum exhauster is connected to the exhaust pipe 231 through a pressure sensor 245 and an APC (Automatic Pressure Controller) valve 243. The pressure sensor 245 serves as a pressure detector (pressure meter) to detect an inner pressure of the process chamber 201, and the APC valve 243 serves as a pressure regulator (pressure regulating device). The vacuum pump 246 is configured to vacuum-exhaust an inner atmosphere of the process chamber 201 such that the inner pressure of the process chamber 201 reaches a predetermined pressure (vacuum degree). The exhaust pipe 232 at a downstream side of the vacuum pump 246 is connected to a component such as a waste gas processing apparatus (not shown). The APC valve 243 serves as an opening/closing valve. With the vacuum pump 246 in operation, the APC valve 243 may be opened or closed to vacuum-exhaust the process chamber 201 or to stop the vacuum exhaust. With the vacuum pump 246 in operation, by adjusting an opening degree of the APC valve 243, the APC valve 243 is configured to adjust the inner pressure of the process chamber 201 by adjusting a conductance thereof. An exhaust system is constituted mainly by the exhaust pipe 231, the APC valve 243, the vacuum pump 246 and the pressure sensor 245.

A temperature sensor 263 serving as a temperature detector is provided in the reaction tube 203. The electric power supplied to the heater 207 is adjusted based on temperature information detected by the temperature sensor 263 such that a desired temperature distribution of an inner temperature of the process chamber 201 is obtained. The temperature sensor 263 is L-shaped, and is provided along the inner wall of the reaction tube 203 to penetrate a manifold 209.

The boat 217 is provided at the center portion of the reaction tube 203. The boat 217 may be elevated or lowered (loaded or unloaded) with respect to the reaction tube 203 by the boat elevator 115. When the boat 217 is loaded into the reaction tube 203, the lower end opening of the reaction tube 203 is airtightly sealed by the seal cap 219 via the O-ring 220. The boat 217 is supported by the boat support 218. In order to improve a uniformity of the substrate processing, by operating the boat rotator 267, the boat 217 supported by the boat support 218 is rotated.

Figure 5:
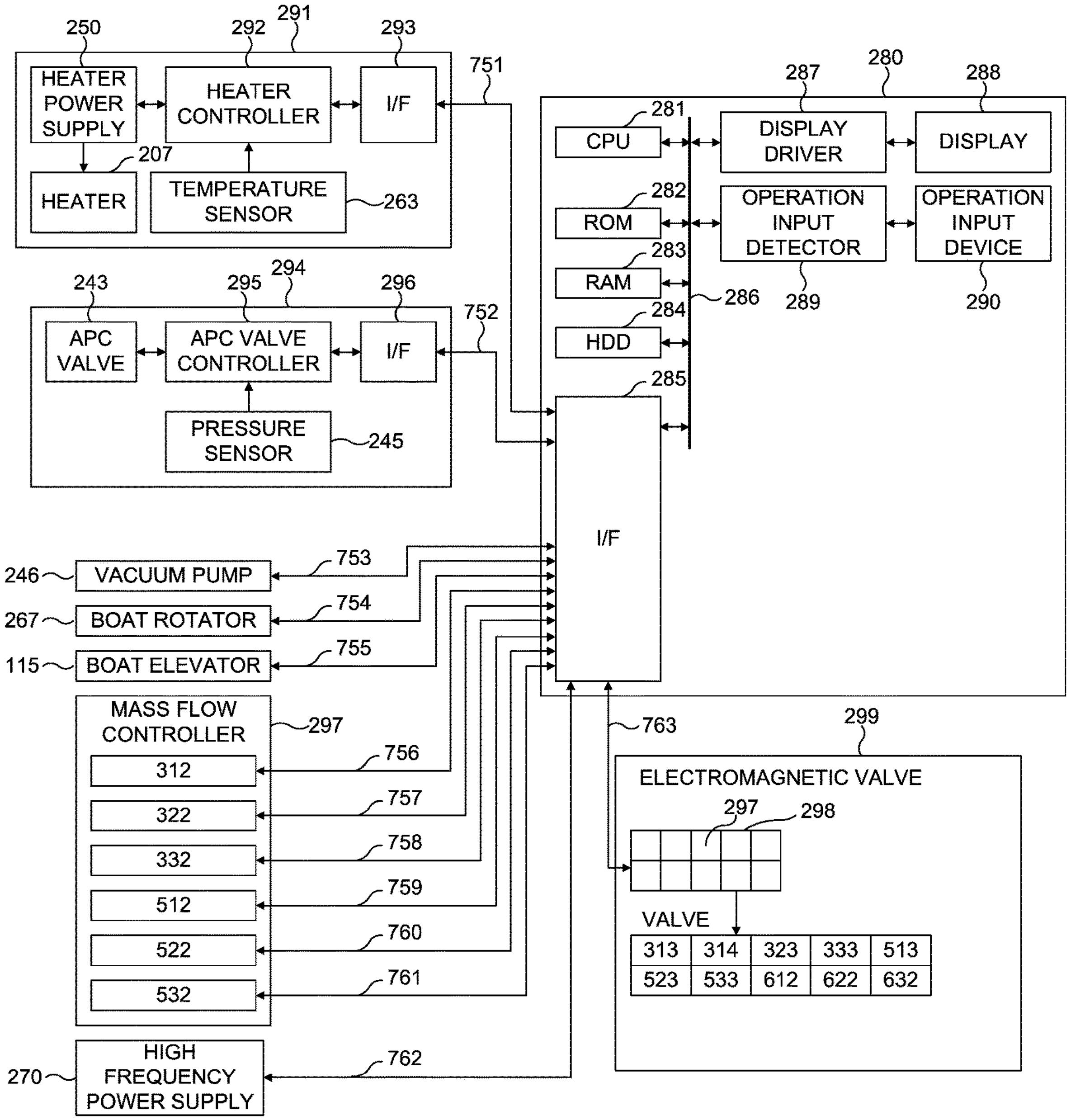
FIG. 5 is a block diagram schematically illustrating a controller and related components of the remote plasma processing apparatus according to the first embodiment described herein.

Referring to FIG. 5, a controller 280 of the substrate processing apparatus 101 may include: a display 288 configure to display various information such as an operation menu; and an operation input device 290 including a plurality of keys and configured to input various information and operation instructions. The controller 280 may further include: a CPU (Central Processing Unit) 281 configured to control the overall operation of the substrate processing apparatus 101; a ROM (Read-Only Memory) 282 configured to store various programs including a control program in advance; a RAM (Random Access Memory) 283 configured to temporarily store various data; an HDD (Hard Disk Drive) 284 configured to store various data; a display driver 287 configured to control the display of various information on the display 288 and to receive operation information from the display 288; an operation input detector 289 configured to detect an operation state of the operation input device 290; and a communication interface ("I/F" in FIG. 5) 285 configured to exchange (that is, transmit or receive) various information with components such as a temperature controller 291 described later; a pressure controller 294 described later, the vacuum pump 246, the boat rotator 267, the boat elevator 115, the liquid mass flow controller 312, the mass flow controllers 322, 332, 512, 522 and 532 and a valve controller 299 described later.

The CPU 281, the ROM 282, the RAM 283, the HDD 284, the display driver 287, the operation input detector 289 and the communication interface 285 are connected to one another via a system bus 286. Therefore, the CPU 281 can access the ROM 282, the RAM 283 and the HDD 284, can control the display of the various information on the display 288 via the display driver 287, can receive the operation information from the display 288 via the display driver 287, and can control transmission/reception of the various information to or from the components described above via the communication interface 285. In addition, the CPU 281 can grasp the operation state of a user with respect to the operation input device 290 via the operation input detector 289.

The temperature controller 291 may include: the heater 207; a heater power supply 250 configured to supply electric power to the heater 207; the temperature sensor 263; a communication interface ("I/F" in FIG. 5) 293 configured to exchange (that is, transmit or receive) various information such as pre-set temperature information with the controller 280; and a heater controller 292 configured to control the electric power supplied from the heater power supply 250 to the heater 207 based on information such as the pre-set temperature information received through the communication interface 293 and the temperature information from the temperature sensor 263. The heater controller 292 may be implemented with a computer. The communication interface 293 of the temperature controller 291 and the communication interface 285 of the controller 280 are connected by a cable 751.

The pressure controller 294 may include: a communication interface ("I/F" in FIG. 5) 296 configured to exchange (that is, transmit or receive) various information such as a pre-set pressure information and opening/closing information of the APC valve 243 with the APC valve 243, the pressure sensor 245 and the controller 280; and an APC valve controller 295 configured to control the opening degree of the APC valve 243 and an opening and closing operation of the APC valve 243 based on information such as the pre-set pressure information received through the communication interface 296, the opening/closing information of the APC valve 243 and pressure information from the pressure sensor 245. The APC valve controller 295 may be implemented with a computer. The communication interface 296 of the pressure controller 294 and the communication interface 285 of the controller 280 are connected by a cable 752.

The vacuum pump 246, the boat rotator 267, the boat elevator 115, the liquid mass flow controller 312, the mass flow controllers 322, 332, 512, 522 and 532 and the high frequency power supply 270 are connected to the communication interface 285 of the controller 280 by cables 753, 754, 755, 756, 757, 758, 759, 760, 761 and 762, respectively.

The valve controller 299 may include: the valves 313, 314, 323, 333, 513, 523, 533, 612, 622 and 632 serving as air valves; and an electromagnetic valve group 298 configured to control the supply of the air to the valves 313, 314, 323, 333, 513, 523, 533, 612, 622 and 632. The electromagnetic valve group 298 may include electromagnetic valves 297 corresponding to the valves 313, 314, 323, 333, 513, 523, 533, 612, 622 and 632, respectively. The electromagnetic valve group 298 and the communication interface 285 of the controller 280 are connected by a cable 763.

As described above, the components such as the liquid mass flow controller 312, the mass flow controllers 322, 332, 512, 522 and 532, the valves 313, 314, 323, 333, 513, 523, 533, 612, 622 and 632, the APC valve 243, the heater power supply 250, the temperature sensor 263, the pressure sensor 245, the vacuum pump 246, the boat rotator 267, the boat elevator 115 and the high frequency power supply 270 are connected to the controller 280. The CPU 281 may be configured to control various operations such as a flow rate adjusting operation of the liquid mass flow controller 312, flow rate adjusting operations of the mass flow controllers 322, 332, 512, 522 and 532, opening/closing operations of the valves 313, 314, 323, 333, 513, 523, 533, 612, 622 and 632, an opening/closing operation of the APC valve 243, a pressure adjusting operation by the APC valve 243 such as a control operation of the opening degree of the APC valve 243 based on the pressure information from the pressure sensor 245, a temperature adjusting operation of the heater 207 based on the temperature sensor (not shown) such as an adjusting operation of a power supply amount from the heater power supply 250 to the heater 207 based on the temperature information from the temperature sensor 263, a control operation of the high frequency power supplied from the high frequency power supply 270, a start and stop control operation of the vacuum pump 246, an adjusting operation of a rotation speed of the boat rotator 267, and an elevating and lowering operation of the boat elevator 115.

Hereinafter, an example of the substrate processing, which is a part of manufacturing processes of a semiconductor device such as an LSI (Large Scale Integration) circuit, will be described. The substrate processing is performed by using the above-described substrate processing apparatus 101. Hereinafter, the operations of the components of the substrate processing apparatus 101 are controlled by the controller 280.

According to the conventional CVD method, for example, a plurality of types of gases containing a plurality of elements constituting a film to be formed are simultaneously supplied onto the substrate to be processed to form the film. According to the conventional ALD method, a plurality of types of gases containing a plurality of elements constituting a film to be formed are alternately supplied onto the substrate to be processed to form the film. Then, a silicon oxide film (also referred to as an "SiO film") or a silicon nitride film ($Si_3N_4$ film) may be formed by controlling the process conditions (or supply conditions) such as a supply flow rate, a supply time (time duration) and power of the plasma when a plurality of types of gases are supplied according to the conventional CVD method or the conventional ALD method. According to the conventional CVD method or the conventional ALD method, for example, when the forming the SiO film, the supply conditions are controlled such that a composition ratio of the film is substantially equal to a stoichiometric composition (that is, a ratio of oxygen (O) to silicon (Si) is substantially equal to 2). Further, when forming the $Si_3N_4$ film, the supply conditions are controlled such that the composition ratio of the film is substantially equal to the stoichiometric composition (that is, a ratio of nitrogen (N) to silicon (Si) is substantially equal to 1.33).

On the other hand, the supply conditions may be controlled such that the composition ratio of the film to be formed may be a predetermined composition ratio different from the stoichiometric composition. That is, for example, the supply conditions may be controlled such that at least one element of the plurality of the elements constituting the film to be formed may be in excess of the other elements with respect to the stoichiometric composition. As described above, it is possible to from the film while controlling a ratio of the plurality of the elements constituting the film to be formed, that is, while controlling the composition ratio of the film.

Hereinafter, an exemplary sequence of forming the silicon nitride film whose composition ratio is equal to the stoichiometric composition thereof by alternately supplying a plurality of types of gases containing a plurality of elements will be described.

An example forming the silicon nitride film serving as an insulating film on the substrate in a wiring step (also referred to as a "BEOL process") will be described with reference to FIG. 6. In the exemplary sequence, silicon (Si) is used as a first element, nitrogen (N) is used as a second element, BTBAS gas serving as a silicon-containing source obtained by vaporizing BTBAS ($SiH_2(NH(C_4H_9)_2$, bis(tertiary-butylamino)silane) (which is a liquid source) is used as a source containing the first element and $NH_3$ gas (which is a nitrogen-containing gas) is used as a reactive gas containing the second element.

Figure 6:
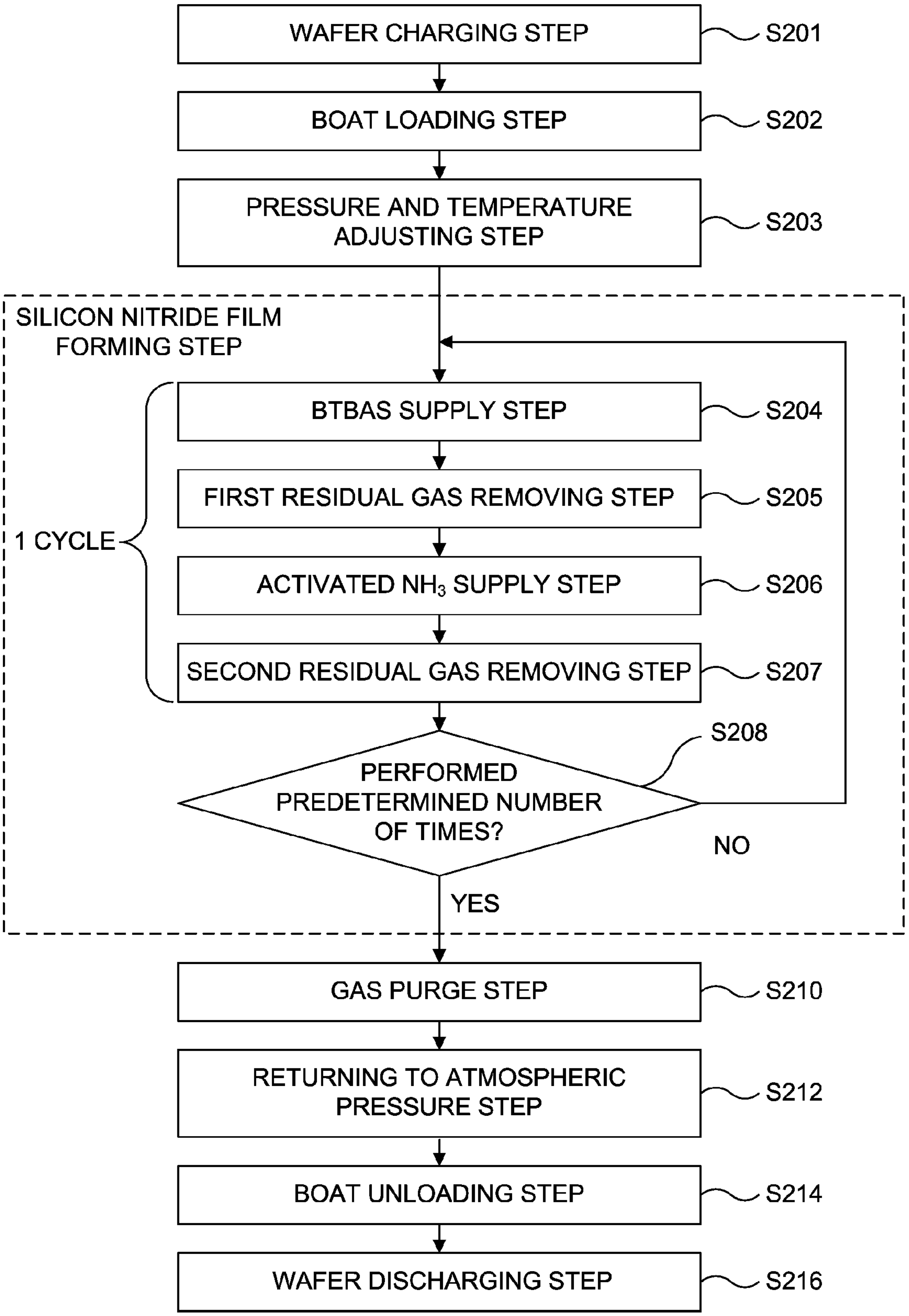
FIG. 6 is a flow chart schematically illustrating manufacturing processes of a silicon nitride film according to the first embodiment described herein.

FIG. 6 is a flow chart schematically illustrating manufacturing processes of the silicon nitride film according to the present embodiment described herein. First, the heater power supply 250 configured to supply the electric power to the heater 207 is controlled to maintain the inner temperature of the process chamber 201 at a predetermined temperature of 200° C. or lower, more preferably, 100° C. or lower. For example, the predetermined temperature may be set to 100° C.

Then, the plurality of the wafers including the wafer 200 are transferred (charged) into the boat 217 (wafer charging step S201). Thereafter, the vacuum pump 246 is operated. In addition, the furnace opening shutter 147 (refer to FIG. 2) is opened. The boat 217 accommodating the plurality of the wafers including the wafer 200 is transferred (loaded) into the process chamber 201 by the boat elevator 115 (boat loading step S202). With the boat 217 loaded in the process chamber 201, the lower end opening of the reaction tube 203 is airtightly sealed by the seal cap 219 via the O-ring 220. Thereafter, the boat 217 is rotated by the boat rotator 267 to rotate the plurality of the wafers.

Thereafter, the APC valve 243 is opened and the vacuum pump 246 vacuum-exhausts the inner atmosphere of the process chamber 201 until the inner pressure of the process chamber 201 reaches a desired pressure (vacuum degree), and the temperature of the wafer 200 is stabilized, for example, when the temperature of the wafer 200 reaches 100° C. (pressure and temperature adjusting step S203). Then, while maintaining the inner temperature of the process chamber 201 at 100° C., the following steps are sequentially performed.

In the pressure and temperature adjusting step S203, the inner pressure of the process chamber 201 is measured by the pressure sensor 245, and the opening degree of the APC valve 243 is feedback-controlled based on the pressure information measured by the pressure sensor 245 (pressure adjusting step). In addition, the heater 207 heats the process chamber 201 until the inner temperature of the process chamber 201 reaches a desired temperature. A state of the electric power supply from the heater power supply 250 to the heater 207 is feedback-controlled based on the temperature information detected by the temperature sensor 263 such that the inner temperature of the process chamber 201 reaches the desired temperature (temperature adjusting step).

Subsequently, a silicon nitride film forming step of forming the silicon nitride film by supplying the BTBAS gas and the $NH_3$ gas (radical) into the process chamber 201 is performed. In the silicon nitride film forming step, the following four steps S204 through S207 are sequentially and repeatedly performed.

<BTBAS Supply Step S204>

In the BTBAS supply step S204, the BTBAS gas is supplied into the process chamber 201 through the gas supply pipe 310 and the nozzle 410 of the gas supply system 301. The valve 313 is closed and the valves 314 and 612 are opened. The BTBAS is in a liquid state at room temperature, and the BTBAS in the liquid state is supplied to the vaporizer 315 after a flow rate of the BTBAS in the liquid state is adjusted by the liquid mass flow controller 312, and then vaporized by the vaporizer 315. Before supplying the BTBAS gas to the process chamber 201, with the valve 313 closed and the valve 612 open, the BTBAS gas is introduced (supplied) to the vent line 610 through the valve 612.

When the BTBAS gas is supplied to the process chamber 201, with the valve 612 closed and the valve 313 open, the BTBAS gas is supplied to the gas supply pipe 310 at the downstream of the valve 313. In addition, with the valve 513 open, the carrier gas is supplied through the carrier gas supply pipe 510. The flow rate of the carrier gas such as $N_2$ gas is adjusted by the mass flow controller 512. The BTBAS gas joins and is mixed with the carrier gas at the downstream side of the valve 313. Then, the BTBAS gas together with the carrier gas is supplied to the process chamber 201 through the plurality of the gas supply holes 411 of the nozzle 410, and is exhausted through the exhaust pipe 231. In the BTBAS supply step S204, the APC valve 243 is appropriately adjusted (controlled) to adjust the inner pressure of the process chamber 201 to a predetermined pressure. For example, the predetermined pressure in the BTBAS supply step S204 may range from 50 Pa to 900 Pa. For example, the predetermined pressure in the BTBAS supply step S204 may be set to 300 Pa. For example, a supply flow rate of the BTBAS adjusted by the liquid mass flow controller 312 may be set to a predetermined flow rate ranging from 0.05 g/min to 3.00 g/min. For example, the predetermined flow rate in the BTBAS supply step S204 may be set to 1.00 g/min. For example, a time duration (also referred to as a "gas supply time") of exposing (supplying) the BTBAS gas to the wafer 200 may be set to a predetermined time ranging from 2 seconds to 6 seconds. For example, the predetermined time in the BTBAS supply step S204 may be set to 3 seconds. For example, by controlling the heater power supply 250 supply the electric power to the heater 207, the heater 207 heats the process chamber 201 such that the inner temperature of the process chamber 201 is maintained to a predetermined temperature of 200° C. or less, and preferably 100° C. or less. For example, the predetermined temperature in the BTBAS supply step S204 may be set to 100° C.

In the BTBAS supply step S204, the BTBAS gas and the $N_2$ gas serving as the carrier gas (inert gas) are supplied into the process chamber 201 without any other gas being supplied into the process chamber 201 together with the BTBAS gas and the $N_2$ gas. In addition, there is no $NH_3$ radical in the process chamber 201. Therefore, without causing a gas phase reaction, the BTBAS reacts with the surface of the wafer 200 or a base film of the wafer 200 by a surface reaction (chemisorption). As a result, an adsorption layer of the source (BTBAS) or a silicon-containing layer is formed as a first layer. The silicon-containing layer may refer to a layer of molecules containing a part of the dissociated BTBAS molecules. For example, the silicon-containing layer may refer to a film containing silicon without containing other elements. The surface of the wafer 200 may be covered with a material without containing silicon (for example, a carbon film) at an initial stage of the BTBAS supply step S204.

In the BTBAS supply step S204, a small amount of the $N_2$ gas (inert gas) may be supplied through the carrier gas supply pipe 520 connected in the middle of the gas supply pipe 320 by opening the valve 523. When the small amount of the $N_2$ gas is supplied, it is possible to prevent the BTBAS from entering the nozzle 420 configured to supply the $NH_3$ gas, the buffer chamber 423 and the gas supply pipe 320.

<First Residual Gas Removing Step S205>

In the first residual gas removing step S205, a residual gas in the process chamber 201 such as a residual BTBAS gas is removed from the process chamber 201. The valve 313 of the gas supply pipe 310 is closed to stop the supply of the BTBAS gas to the process chamber 201, and the valve 612 is opened to supply the BTBAS gas to the vent line 610. In the first residual gas removing step S205, with the APC valve 243 of the exhaust pipe 231 fully open, the vacuum pump 246 vacuum-exhausts the inner atmosphere of the process chamber 201 such that the inner pressure of the process chamber 201 reaches 20 Pa or less. As a result, the residual gas in the process chamber 201 such as the residual BTBAS gas is removed from the process chamber 201. In the first residual gas removing step S205, in order to improve the efficiency of removing the residual gas in the process chamber 201 such as the residual BTBAS gas, the inert gas such as the $N_2$ gas may be supplied into the process chamber 201 through the gas supply pipe 310 serving as a BTBAS supply line and further through the gas supply pipes 320 and 330.

<Activated $NH_3$ Supply Step S206>

In the activated $NH_3$ supply step S206, the $NH_3$ gas is supplied though the gas supply pipe 320 of the gas supply system 302 into the buffer chamber 423 via the plurality of the gas supply holes 421 of the nozzle 420, and $NH_3$ gas is also supplied through the gas supply pipe 330 of the gas supply system 303 into the buffer chamber 433 via the plurality of the gas supply holes 431 of the nozzle 430. When the $NH_3$ gas is supplied, by applying the high frequency power between the rod-shaped electrode 471 and the rod-shaped electrode 472 from the high frequency power supply 270 through the matcher 271, the $NH_3$ gas is supplied into the buffer chamber 423 is excited by the plasma, is supplied into the process chamber 201 as an active species through the plurality of the gas supply holes 425, and then is exhausted through the gas exhaust pipe 231. The same also applies to the $NH_3$ gas supplied into the buffer chamber 433.

The $NH_3$ gas whose flow rate is adjusted by the mass flow controller 322 is supplied into the buffer chamber 423 through the gas supply pipe 320, and the $NH_3$ gas whose flow rate is adjusted by the mass flow controller 332 is supplied into the buffer chamber 433 through the gas supply pipe 330. When $NH_3$ gas is supplied into the buffer chamber 423, with the valve 622 closed and the valve 323 open, the $NH_3$ gas is supplied to the gas supply pipe 320 at the downstream of the valve 323, and the valve 523 may be opened to supply the carrier gas (the $N_2$ gas) is supplied through the carrier gas supply pipe 520. That is, the $NH_3$ gas together with the carrier gas may be supplied into the buffer chamber 423 through the nozzle 420. When $NH_3$ gas is supplied into the buffer chamber 433, with the valve 632 closed and the valve 333 open, the $NH_3$ gas is supplied to the gas supply pipe 330 at the downstream of the valve 333. The $NH_3$ gas is supplied into the buffer chamber 433 through the nozzle 430.

When the $NH_3$ gas is supplied as the active species by plasma-exciting the $NH_3$ gas, the APC valve 243 is appropriately adjusted to adjust (set) the inner pressure of the process chamber 201 to a predetermined pressure ranging from 50 Pa to 900 Pa. For example, the predetermined pressure in the activated $NH_3$ supply step S206 may be set to 500 Pa. For example, supply flow rates of the $NH_3$ gas controlled by the mass flow controller 322 and the mass flow controller 332 may be set to predetermined flow rates ranging from 2,000 sccm to 9,000 sccm, respectively. For example, a time duration (also referred to as a "gas supply time") of exposing (supplying) the active species obtained by plasma-exciting the $NH_3$ gas to the wafer 200 may be set to a predetermined time ranging from 3 seconds to 20 seconds. For example, the predetermined time in the activated $NH_3$ supply step S206 may be set to 9 seconds. For example, the high frequency power applied from the high frequency power supply 270 between the rod-shaped electrode 471 and the rod-shaped electrode 472 may be set to a predetermined power ranging from 20 W to 600 W whose frequency ranging is 13.56 MHz or 27.12 MHz. For example, the predetermined power in the activated $NH_3$ supply step S206 may be set to 200 W. The same also applies to the high frequency power applied from the high frequency power supply 270 between the rod-shaped electrode 481 and the rod-shaped electrode 482. Since a reaction temperature of the $NH_3$ gas itself is high, it is difficult to react the $NH_3$ gas with the first layer at the temperature of the wafer 200 and the inner pressure of the process chamber 201 described above. Therefore, the active species obtained by plasma-exciting the $NH_3$ gas is supplied onto the wafer 200. As a result, it is possible to set the temperature of the wafer 200 to a low temperature such as the predetermined temperature of 200° C. or less.

In the activated $NH_3$ supply step S206, a gas supplied into the process chamber 201 contains the active species ($NH_3$*) obtained by plasma-exciting the $NH_3$ gas with a predetermined ratio, and the BTBAS gas is not supplied into the process chamber 201. Therefore, without causing a gas phase reaction, the active species ($NH_3$*) or the activated $NH_3$ gas reacts with the first layer formed on the wafer 200. That is, the $NH_3$ gas is plasmatized or activated in the activated $NH_3$ supply step S206. As a result, the first layer is nitrided and modified into a second layer containing silicon as the first element and nitrogen as the second element, that is, a silicon nitride layer ($Si_3N_4$ layer).

In the activated $NH_3$ supply step S206, the $N_2$ gas (inert gas) may be supplied through the carrier gas supply pipe 510 connected in the middle of the gas supply pipe 310 by opening the valve 513. When the $N_2$ gas is supplied, it is possible to prevent the $NH_3$ gas from entering the nozzle 410 configured to supply the BTBAS gas and the gas supply pipe 310.

<Second Residual Gas Removing Step S207>

In the second residual gas removing step S207, a residual gas in the process chamber 201 such as a residual $NH_3$ gas which did not react or which contributed to the formation of the first layer is removed from the process chamber 201. The valve 323 of the gas supply pipe 320 and the valve 333 of the gas supply pipe 330 are closed to stop the supply of the $NH_3$ gas to the process chamber 201. In the second residual gas removing step S207, with the APC valve 243 of the exhaust pipe 231 fully open, the vacuum pump 246 vacuum-exhausts the inner atmosphere of the process chamber 201 such that the inner pressure of the process chamber 201 reaches 20 Pa or less. As a result, the residual gas in the process chamber 201 such as the residual $NH_3$ gas is removed from the process chamber 201.

By performing a cycle including the BTBAS supply step S204 through the second residual gas removing step S207 at least once (step S208), the silicon nitride film of a predetermined thickness is formed on the wafer 200.

After the silicon nitride film forming step of forming the silicon nitride film of a predetermined thickness is completed, the inner atmosphere of the process chamber 201 is purged with the inert gas by supplying the inert gas such as the $N_2$ gas into the process chamber 201 and exhausting the inert gas such as the $N_2$ gas from the process chamber 201 (gas purge step S210). The gas purge step S210 may be preferably performed by repeatedly performing a cycle including: supplying the inert gas such as the $N_2$ gas into the process chamber 201 with the APC valve 243 closed and the valves 513, 523 and 533 open after the residual gas is removed from the process chamber 201; and vacuum-exhausting the inner atmosphere of the process chamber 201 with the APC valve 243 open after stopping the supply of the inert gas such as the $N_2$ gas into the process chamber 201 by closing the valves 513, 523 and 533.

Thereafter, the boat rotator 267 is stopped and the rotation of the boat 217 is stopped. Thereafter, by opening the valves 513, 523 and 533, the inner atmosphere of the process chamber 201 is replaced with the inert gas such as the $N_2$ gas (substitution by the inert gas), and the inner pressure of the process chamber 201 is returned to the atmospheric pressure (returning to the atmospheric pressure step S212). Thereafter, the seal cap 219 is lowered by the boat elevator 115 and the lower end opening of the reaction tube 203 is opened. The boat 217 with the plurality of processed wafers including the wafer 200 charged therein is unloaded out of the reaction tube 203 through the lower end opening of the reaction tube 203 (boat unloading step S214). After the boat 217 is unloaded, the lower end opening of the reaction tube 203 is sealed by the furnace opening shutter 147. Then, the vacuum pump 246 is stopped. Thereafter, the plurality of the processed wafers including the wafer 200 are discharged from the boat 217 (wafer discharging step S216). Thereby, a first batch process of a film-forming process (that is, the substrate processing) is completed.

Other Embodiments

While the technique is described in detail by way of the above-described embodiment, the above-described technique is not limited thereto. The above-described technique may be modified in various ways without departing from the gist thereof. For example, the above-described embodiment is described in detail for better understanding of the technique, and the technique is not limited to the configuration of the embodiment. For example, while the above-described embodiment is described by way of an example in which the pair of the discharge electrodes are provided, the technique is not limited thereto. For example, the above-described embodiment may also be applied when three or more discharge electrodes are provided substantially in parallel. When three discharge electrodes are provided, the discharge electrode provided at a center among the three discharge electrodes may be grounded, and the electric power may be supplied to the two discharge electrodes on both sides of the grounded discharge electrode.

In addition, while the above-described embodiment is described by way of an example in which the functions of the components described above such as the controllers and the CPU may be implemented as a program capable of performing some or entire functions of the components, the technique is not limited thereto. For example, the above-described embodiment may also be applied when some or entire functions of the components are implemented as a hardware, for example, by designing an integrated circuit. That is, some or entire functions of a processor such as the controllers may be implemented as the integrated circuit such as an ASIC (Application Specific Integrated Circuit) and an FPGA (Field Programmable Gate Array) instead of the program.

According to some embodiments in the present disclosure, it is possible to provide a substrate processing apparatus capable of reducing the damage to the reaction tube and the electrode when processing the substrate using the plasma as well as generating the plasma stably, and to provide a method of manufacturing a semiconductor device using the substrate processing apparatus.

What is claimed is:

1. A substrate processing apparatus comprising:

a process chamber in which a substrate is processed;

a buffer chamber in which a gas is circulated before being supplied to the substrate;

a pair of discharge electrodes extending substantially parallel to each other in the buffer chamber; and a pair of sheath tubes, each of which is made of an insulator, configured to cover the pair of discharge electrodes, respectively, to prevent the pair of discharge electrodes from being exposed to the gas, wherein a metal cap, having a maximum diameter substantially equal to that of each discharge electrode and having a front end formed in a rounded shape, is provided at an end of each discharge electrode, the end being opposite to an end of each discharge electrode supplied with electric power, wherein each discharge electrode comprises a core material and a wire braid provided outside the core material in close contact with each sheath tube, wherein the metal cap is shaped as a solid of revolution and comprises a through-hole formed along a rotation axis of the solid of revolution, and both the core material and the wire braid are inserted into the through-hole, and wherein the core material and the wire braid are crimped and fixed by a set screw that is screwed into a tapped hole extending from a side surface of the metal cap to the through-hole along a direction perpendicular to the rotation axis of the solid of revolution.

2. The substrate processing apparatus according to claim 1, wherein the wire braid is made of a refractory metal, has an outer diameter that is substantially equal to or greater than an inner diameter of each of the sheath tubes in an unconfined state, so that the wire braid inserted into each of the sheath tubes fits to an inner surface of each of the sheath tubes when inserted into each of the sheath tubes.

3. The substrate processing apparatus according to claim 2, wherein the cap is made of a refractory metal and secures the wire braid to the core material applying a predetermined tension to the wire braid so as to come into close contact with each of the sheath tubes alongside the wire braid.

4. The substrate processing apparatus according to claim 1, further comprising a reaction tube in which a plurality of substrates comprising the substrate are arranged and accommodated, wherein the buffer chamber is formed as a single body with the reaction tube such that a surface of the buffer chamber is located adjacent to an inside of the reaction tube, and the buffer chamber comprises:

one or more through-holes provided on the surface adjacent to the inside of the reaction tube and facing an entire region where the plurality of the substrates are arranged; and a gas introduction structure in communication with an inside of the buffer chamber.

5. The substrate processing apparatus according to claim 1, further comprising a reaction tube in which a plurality of substrates comprising the substrate are arranged and accommodated, wherein each of the discharge electrodes is provided along an arrangement direction of the plurality of the substrates, and wherein a portion of each of the sheath tubes is bent.

6. The substrate processing apparatus according to claim 4, further comprising a gas nozzle provided in the reaction tube in parallel with an arrangement direction of the plurality of substrates comprising the substrate; and a controller configured to be capable of forming a film on the plurality of substrates by alternately supplying into the reaction tube: a first gas though the gas nozzle; and an electrically neutral active species through the buffer chamber.

7. The substrate processing apparatus according to claim 5, further comprising a gas nozzle provided in the reaction tube in parallel with the arrangement direction of the plurality of substrates comprising the substrate, wherein a predetermined film is formed on the plurality of the substrates by alternately supplying into the reaction tube: a first gas though the gas nozzle; and an electrically neutral active species through the buffer chamber.

8. The substrate processing apparatus according to claim 1, wherein the cap is made of tungsten, tantalum or molybdenum.

9. The substrate processing apparatus according to claim 2, wherein the cap is made of tungsten, tantalum or molybdenum.

10. The substrate processing apparatus according to claim 2, wherein the core material is configured by forming a metal wire into a coil shape.

11. The substrate processing apparatus according to claim 1, wherein the set screw is not projected from the metal cap.

12. The substrate processing apparatus according to claim 2, further comprising a radio frequency power supply configured to supply the electric power to one of the discharge electrodes at a frequency corresponding to a wavelength greater than 4 times a length of the one of the discharge electrodes, wherein the core material is configured by forming a metal wire into a coil shape.

13. The substrate processing apparatus according to claim 4, wherein the core material is configured by forming a metal wire into a coil shape.

14. The substrate processing apparatus according to claim 2, wherein the wire braid is pressed and fixed to the core material while a predetermined tension is applied to the wire braid.

15. The substrate processing apparatus according to claim 3, wherein the wire braid is pressed and fixed to the core material while a predetermined tension is applied to the wire braid.

16. The substrate processing apparatus according to claim 2, wherein both of the core material and the wire braid completely penetrate the through-hole.

17. A discharge electrode of a pair of discharged electrodes generating a plasma therebetween, comprising:

a core material of a coil-shaped structure;

a wire braid provided around the core material and configured to fit with an inner face of a sheath tube; and a metal cap, having a maximum diameter substantially equal to that of each discharge electrode and having a front end formed in a rounded shape, being provided at an end of each discharge electrode, wherein the end is opposite to an end of each discharge electrode supplied with electric power, wherein the metal cap is shaped as a solid of revolution and comprises a through-hole formed along a rotation axis of the solid of revolution, and both the core material and the wire braid are inserted into the through-hole, and wherein the core material and the wire braid are crimped and fixed by a set screw that is screwed into a tapped hole extending from a side surface of the cap to the through-hole along a direction perpendicular to the rotation axis of the solid of revolution.

18. The substrate processing apparatus according to claim 6, wherein the controller is further configured to be capable of controlling at least one among a supply flow rate, a supply time and power of a plasma generated by the pair of discharge electrodes, so as to form a silicon oxide film or a silicon nitride film with a composition ratio different from a stoichiometric composition.

19. The substrate processing apparatus according to claim 10, wherein the core material comprises a straight metal wire configured to penetrate a center of the core material.

20. The substrate processing apparatus according to claim 2, wherein the cap is formed in a bullet shape.

21. The substrate processing apparatus according to claim 2, wherein the set screw is not projected from the cap.

* * * * *